(12) United States Patent
Zeng et al.

(10) Patent No.: US 8,624,701 B2
(45) Date of Patent: Jan. 7, 2014

(54) ASSEMBLED CIRCUIT AND ELECTRONIC COMPONENT

(75) Inventors: Jian-Hong Zeng, Shanghai (CN); Wei Yang, Shanghai (CN); Shou-Yu Hong, Shanghai (CN); Jian-Ping Ying, Shanghai (CN)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 13/602,326

(22) Filed: Sep. 4, 2012

(65) Prior Publication Data

US 2012/0327625 A1 Dec. 27, 2012

Related U.S. Application Data

(62) Division of application No. 12/348,105, filed on Jan. 2, 2009, now Pat. No. 8,283,789.

(30) Foreign Application Priority Data

Jan. 3, 2008 (TW) .............................. 97100160 A

(51) Int. Cl.
*H01F 5/00* (2006.01)
(52) U.S. Cl.
USPC ........... 336/200; 336/186; 336/187; 336/205; 336/208; 257/528; 257/531; 257/698; 257/700; 257/774

(58) Field of Classification Search
USPC .......... 336/186, 187, 200, 205, 208; 257/528, 257/531, 698, 700, 774
See application file for complete search history.

(56) References Cited

U.S. PATENT DOCUMENTS

| | | | | |
|---|---|---|---|---|
| 6,930,584 | B2 * | 8/2005 | Edo et al. | 336/200 |
| 7,268,659 | B2 * | 9/2007 | Nishio et al. | 336/200 |
| 7,971,340 | B2 * | 7/2011 | Hebert et al. | 29/602.1 |
| 2004/0124961 | A1 * | 7/2004 | Aoyagi | 336/200 |
| 2008/0136575 | A1 * | 6/2008 | Edo et al. | 336/200 |
| 2008/0143468 | A1 * | 6/2008 | Yokoyama et al. | 336/200 |

* cited by examiner

*Primary Examiner* — Bac Au
(74) *Attorney, Agent, or Firm* — Litron Patent & Trademark Office; Min-Lee Teng

(57) ABSTRACT

An assembled circuit comprising a substrate, a coil, a first conductive segment, a second conductive segment, a first through-hole connector and a second through-hole connector is disclosed. The first conductive segment is electrically connected to one end of the first through-hole connector, the other end of the first through-hole connector is electrically connected to one end of the second through-hole connector via the first conductive segment, and the other end of the second through-hole connector is electrically connected to the second conductive segment.

19 Claims, 21 Drawing Sheets

US 8,624,701 B2

ASSEMBLED CIRCUIT AND ELECTRONIC COMPONENT

CROSS-REFERENCE TO RELATED APPLICATION

This application is a divisional of U.S. patent application Ser. No. 12/348,105 filed on Jan. 2, 2009, now U.S. Pub. No. 2009/0175014, which claims priority of Taiwan application Ser. No. 097100160 filed on Jan. 3, 2008. The entirety of the above-mentioned patent applications are hereby incorporated by reference herein and made a part of specification.

BACKGROUND OF THE INVENTION

I. Field of the Invention

The present invention relates to an electronic component and an assembled circuit using the same; and more particularly, the present invention relates to an electronic component and an assembled circuit that can improve power density of a power supply as a whole by reducing an overall size of the electronic component.

II. Description of the Prior Art

Nowadays with the development of the power supply technologies, requirements on the power density and the size of a power supply are more and more critical. There exists a variety of methods for increasing the power density of a power supply, among which a popular method is to increase the power density of a power supply by altering some electrical characteristics of the power supply. For example, an operating frequency of the converter may be increased significantly to shrink the sizes of some passive components (e.g., an inductor) in expectation of an improved power density. However, there also exists many factors that have the influence on the power density and the efficiency of a converter, for example, sizes of individual components, the structural design of the converter as a whole and the like. Hereinafter, a point of load (POL) DC to DC converter, which is one kind of DC-DC voltage converter, will be described for illustration purpose.

FIG. 1 is a circuit diagram of a POL DC to DC converter, which is a buck converter herein. The POL DC to DC converter 1 comprises an inductor 11, two switch elements 12, 15 (e.g., Metal Oxide Semiconductor Field-Effect Transistors (MOSFETs)), an output capacitor 13 and a control chip 14. The control chip 14 is configured to receive an output feedback signal and an associated voltage adjustment control signal Vadj to control the operation of the POL DC to DC converter 1.

FIG. 2A and FIG. 2B illustrate a top view and a bottom view of a conventional POL DC to DC converter respectively. The conventional POL DC to DC converter 2 is packaged in a form of an assembled circuit, with conventional through-hole pins being adopted for both input and output pins thereof. As shown, the POL DC to DC converter 2 comprises a control chip 21, a circuit board 22, four input/output (I/O) capacitors 23, a number of through-hole pins 24, a magnetic component (an inductor here) 25 and two switch elements 27. The control chip 21 and the output capacitors 23 are disposed on one side of the carrier 22 which is usually a printed circuit board (PCB), while the magnetic element 25 and the two switch elements 27 are disposed on the other side of the circuit board 22.

The POL DC to DC converter 2 is plugged into a main circuit board (not shown) via the number of through-hole pins 24. However, the through-hole pins 24 occupy a certain area on a surface of the circuit board 22. Furthermore, the supporting effect of the pins 24 causes a certain thickness of the circuit board 22. These inevitably increase the volume of the POL DC to DC converter 2 and further lowers the overall power density thereof.

A top view and a bottom view of another conventional POL DC to DC converter are illustrated in FIG. 3A and FIG. 3B respectively. This conventional POL DC to DC converter 3 is packaged in another form of an assembled circuit, with wave pins being adopted for both input and output pins thereof. In this example, the pins are soldered onto a surface of the circuit board. As shown, the POL DC to DC converter 3 comprises three capacitors 31 (including output capacitors and/or input capacitors), a switch element 32, a plurality of wave pins 33, a carrier 34, a magnetic component 35 and a control chip 36. The capacitors 31, the switch element 32 and the magnetic component 35 are disposed on one side of the carrier 34 which is usually a PCB, while the control chip 36 is disposed on the other side of the carrier 34. The POL DC to DC converter 3 is connected to a main circuit board (not shown) via the wave pins 33.

However, apart from occupying a certain area on the circuit board 34, the wave pins 33 also present a certain height. All these contribute to an increased volume and a decreased power density of the POL DC to DC converter 3.

In summary, the conventional POL DC to DC converters all suffer from the oversized overall volume and the low power density due to the pin arrangement in the conventional package. Therefore, it is highly desirable in the art to provide a novel assembled circuit adapted to improve the power density and shrink the overall size of an electronic apparatus and particularly a voltage converter, thereby to overcome the aforesaid problems.

SUMMARY OF THE INVENTION

One objective of this invention is to provide an assembled circuit for use with a carrier. The assembled circuit is applied to e.g. a DC to DC converter to increase the integration, shrink an overall size and improve a power density of the DC TO DC-converter. The DC to DC converter is e.g. a buck DC TO DC converter, and particularly a point of load (POL) DC to DC converter.

To this end, this invention provides an assembled circuit comprising an inductive component and a first electronic component. The inductive component comprises a connecting conductor adapted to wrap a first surface of the inductive component. The first electronic component stacks on and is electrically connected to the inductive component. The inductive component and the first electronic component are electrically connected to a carrier via the connecting conductor.

Another objective of this invention is to provide an electronic component adapted for an assembled circuit. To this end, the electronic component of this invention comprises an electronic component body and a connecting conductor adapted to warp a first surface of the electronic component body. The electronic component body is electrically connected to a carrier via the connecting conductor.

The detailed technology and preferred embodiments implemented for the subject invention are described in the following paragraphs accompanying the appended drawings for people skilled in this field to well appreciate the features of the claimed invention.

DETAILED DESCRIPTION OF THE INVENTION

To effectively improve the power density and shrink the overall dimensions of an electronic apparatus, particularly a power converter, this invention provides a novel pin scheme adapted to be widely used in a variety of common electronic apparatuses. Referring to FIGS. 4A, 4C and 4B, 4D, top views and bottom views of an inductive component 62 in accordance with a first embodiment of this invention are illustrated respectively therein. More specifically, the inductive component 62 may be an inductor, and in practical application, may be a co-fired magnetic material inductor or a wire wound compressed inductor. It should be noted that, the inductive component 62 in this embodiment is only for purpose of illustration, and in practice, the technology disclosed in this invention may be applied to other electronic component such as a field-effect transistor (FET).

Figure 1:
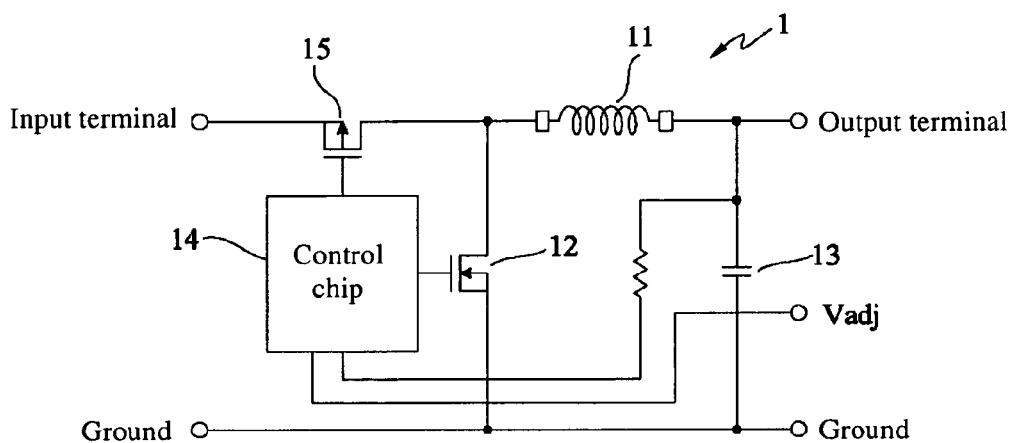
FIG. 1 is a circuit diagram of a conventional point of load (POL) DC to DC converter.
Figure 2A:
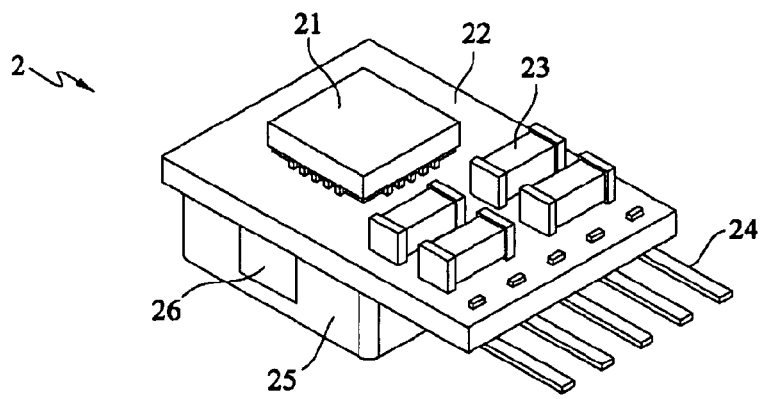
FIG. 2A is a top view of a conventional POL DC to DC converter adopting through-hole pins.
Figure 2B:
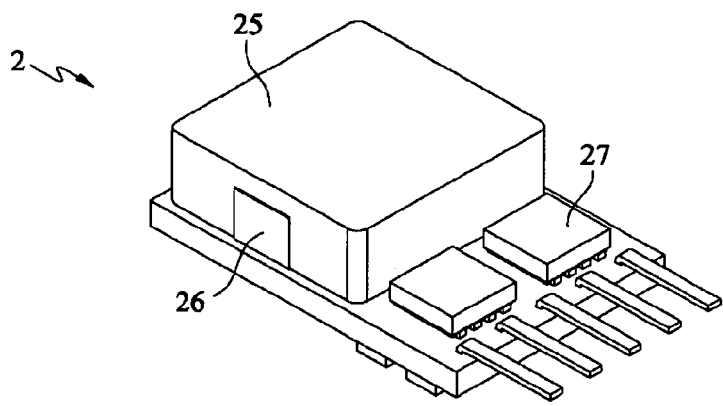
FIG. 2B is a bottom view of a conventional POL DC to DC converter adopting through-hole pins.
Figure 3A:
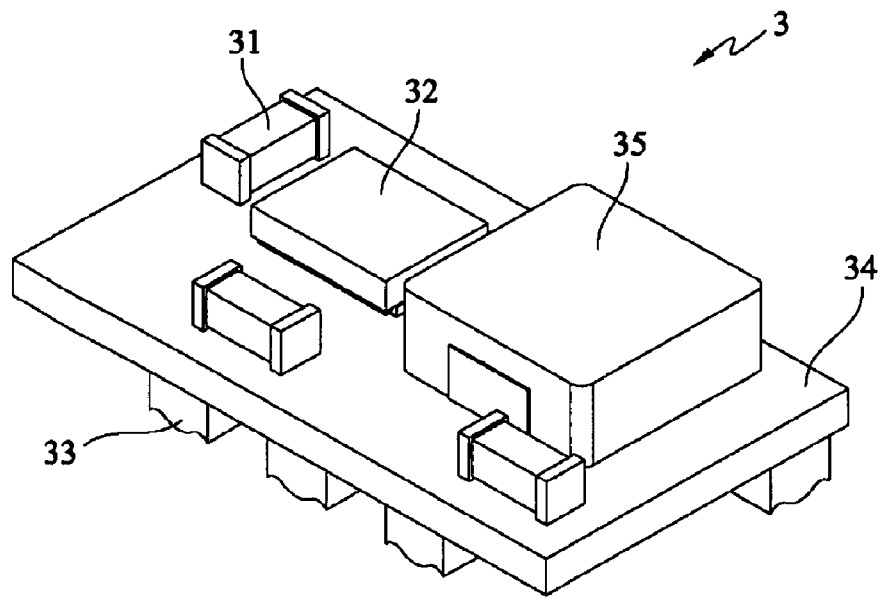
FIG. 3A is a top view of a conventional POL DC to DC converter adopting wave pins.
Figure 3B:
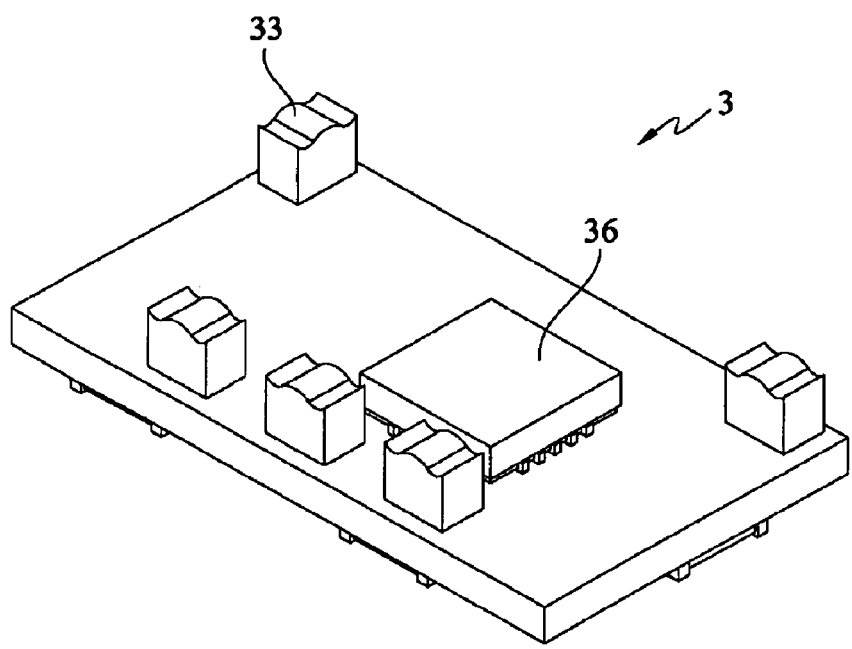
FIG. 3B is a bottom view of a conventional POL DC to DC converter adopting wave pins.
Figure 4A:
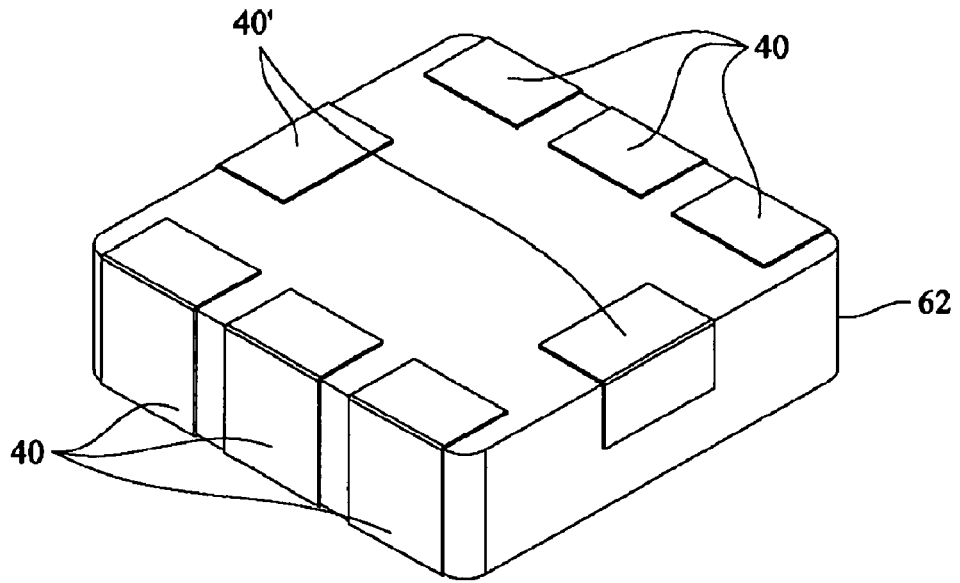
FIG. 4A is a top view of a first electronic component wrapped with a first conductive layer in a DC to DC converter in accordance with a first embodiment of this invention.
Figure 4B:
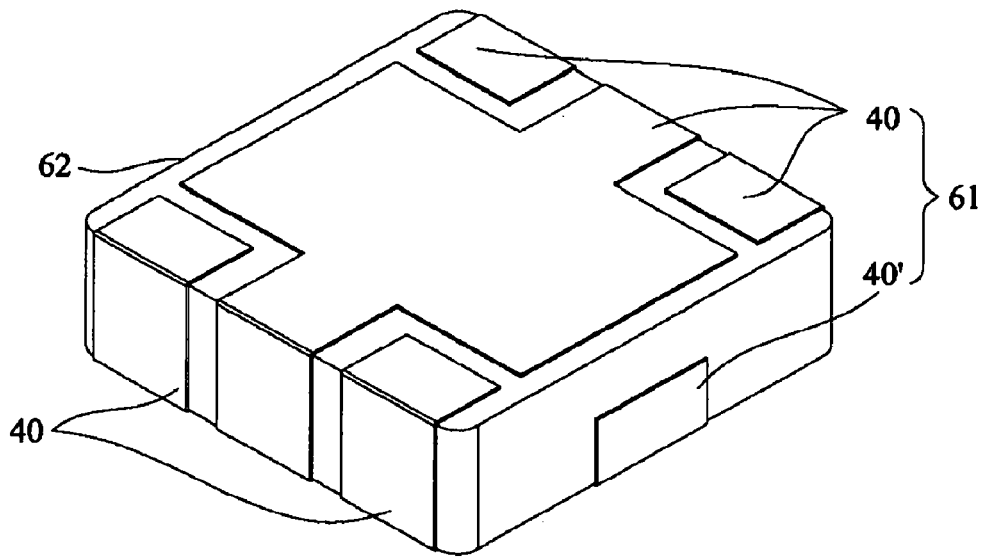
FIG. 4B is a bottom view of a first electronic component wrapped with a first conductive layer in a DC to DC converter in accordance with the first embodiment of this invention.
Figure 4C:
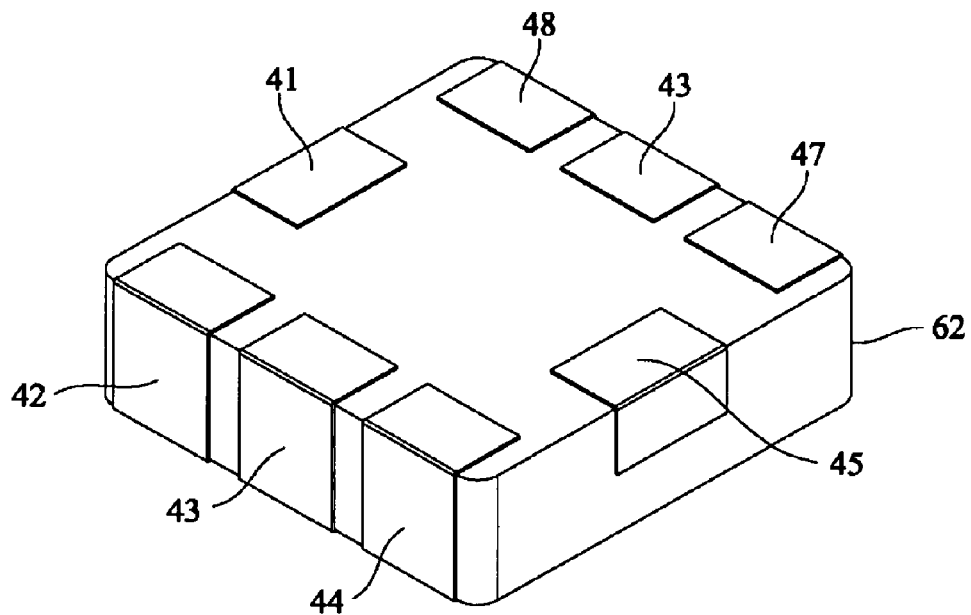
FIG. 4C is another top view of a first electronic component wrapped with a first conductive layer in a DC to DC converter in accordance with a first embodiment of this invention.
Figure 4D:
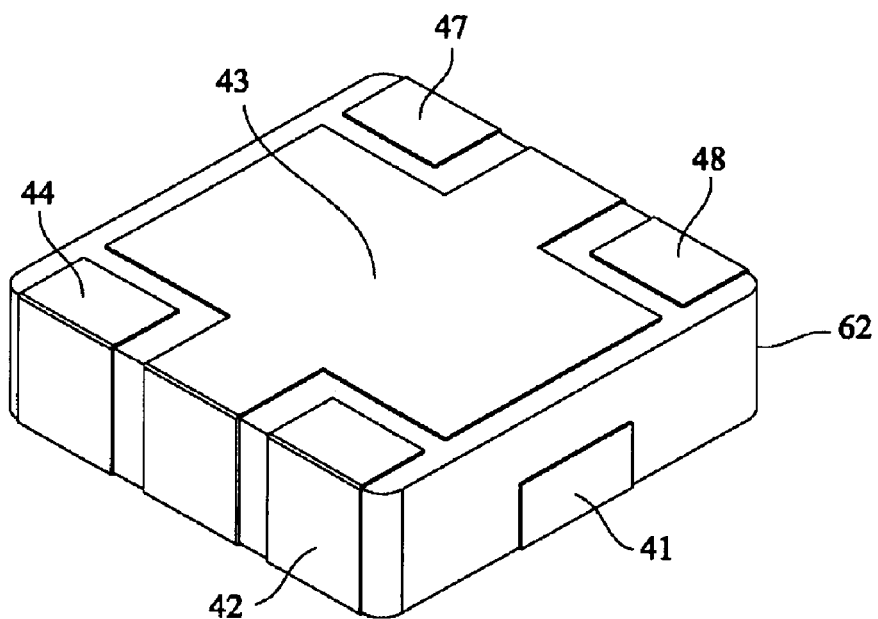
FIG. 4D is another bottom view of a first electronic component wrapped with a first conductive layer in a DC to DC converter in accordance with the first embodiment of this invention.

As one of the characteristics of this invention, an outer surface of the inductive component 62 is wrapped with a first conductive layer 61 on an outer surface thereof. The first conductive layer 61 has a connecting conductor 40 and a pin conductor 40'. The connecting conductor 40 wraps a first surface of the outer surface of the inductive component 62, while the pin conductor 40' wraps a second outer surface of the outer surface of the inductive component 62. The pin conductor 40' acts as pins of the inductive component 62, e.g., as pins of an inductor. When this invention is applied to other electronic component such as an FET, the pin conductor 40' may act as a gate, a source or a drain of the FET. The inductive component 62 by itself is connected to external circuits via the pin conductor 40'. In this embodiment, the first surface comprises several areas of the outer surface of the inductive component 62, including a portion of a side surface, a portion of a top surface and a portion of a bottom surface. The second surface comprises several other areas of the outer surface of the inductive component 62, including other portions of the side surface and other portions of the top surface. The surface oriented upwards in FIG. 4B is defined as the top surface of the inductive component 62, while the surface oriented upwards in FIG. 4A is defined as the bottom surface of the inductive component 62.

Figure 14A:
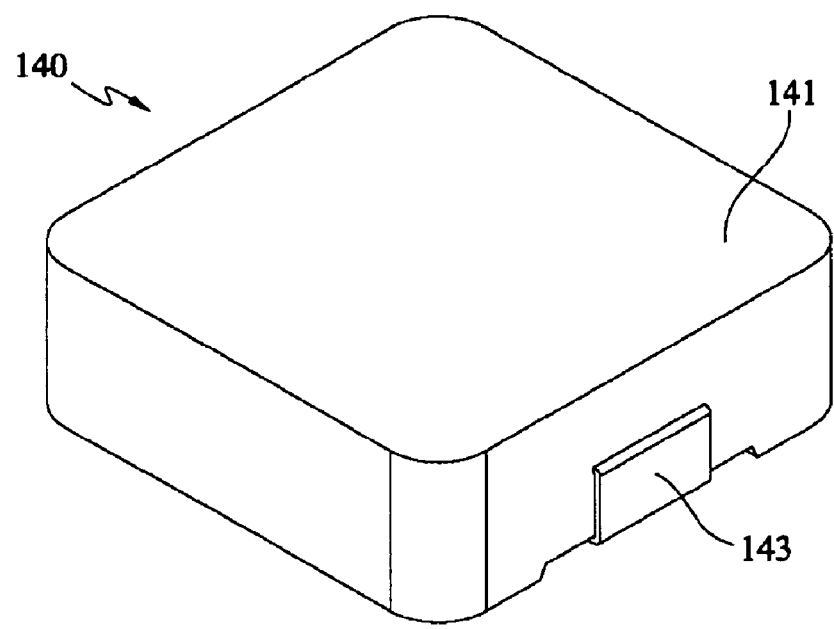
FIG. 14A is a top view of an inductor made of an iron core through a laminating process.
Figure 14B:
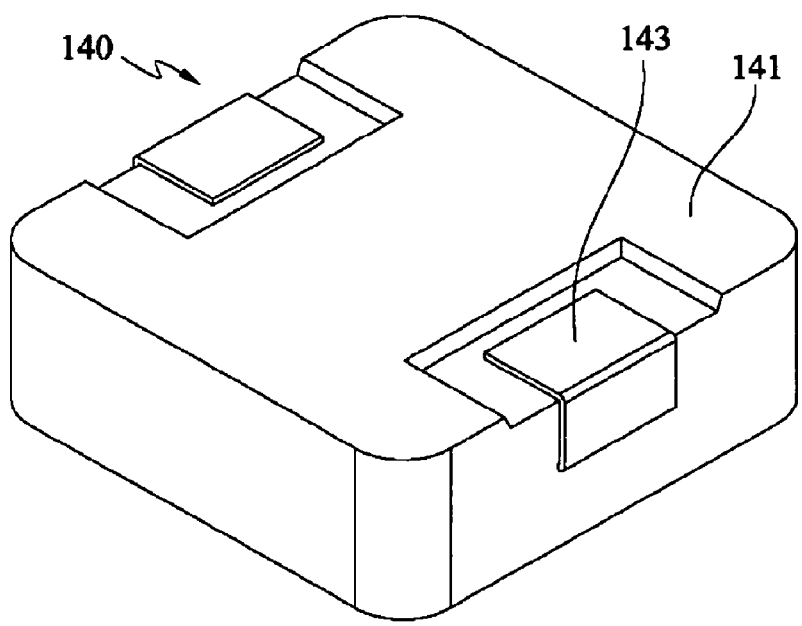
FIG. 14B is a bottom view of an inductor made of an iron core through a laminating process.
Figure 14C:
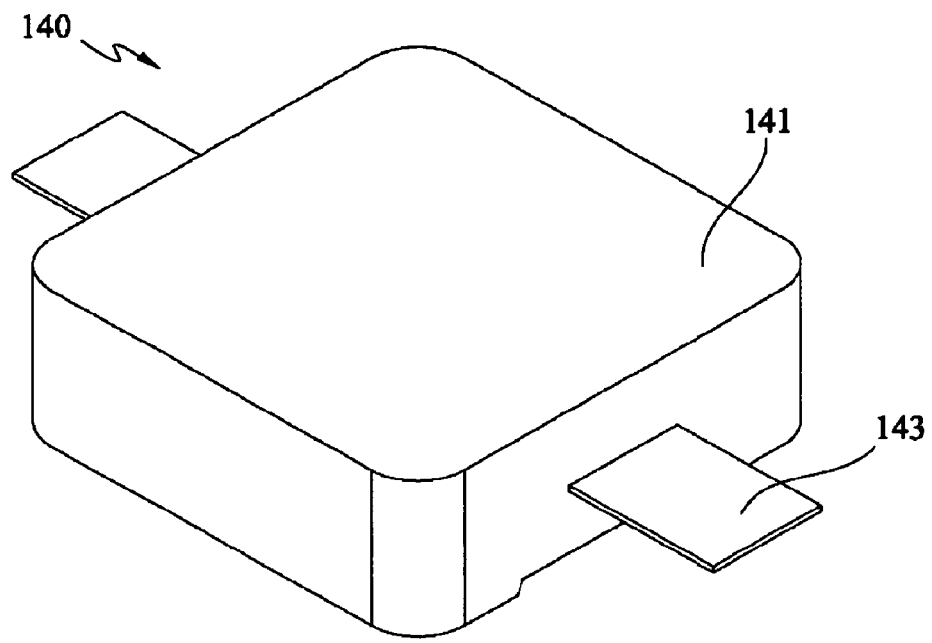
FIG. 14C is a schematic view of coil pins.
Figure 14D:
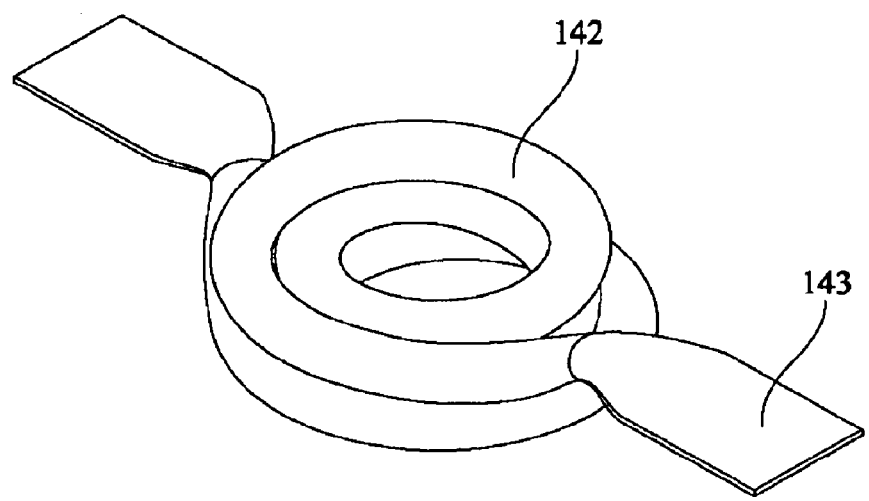
FIG. 14D is a schematic view illustrating a structure of a coil inside an inductor.

Areas of the outer surface of the inductive component 62 covered by the first surface and the second surface recited above and corresponding aspects depicted in the figures are only for purpose of illustration, rather than to limit the scope of this invention. In practical applications, areas belonged to the first surface or the second surface may be optionally adjusted according to practical requirements. Additionally, it should be noted that, the connecting conductor 40 on the outer surface of the inductive component 62 has at least a portion thereof isolated from the pin conductor 40', i.e., no direct physical and electrical connection exists on the outer surface between at least a portion of the connecting conductor 40 and the pin conductor 40'. More specifically, only when the inductive component 62 is connected with other electronic components or a circuit board, will the connecting conductor 40 have at least a portion thereof or total electrically connected with the pin conductor 40' indirectly via the other electronic components or the circuit board. In other aspects, the connecting conductor 40 on the outer surface of the inductive component 62 may be entirely isolated from the pin conductor 40', i.e., no direct physical and electrical connection exists on the outer surface between the entire connecting conductor 40 and the pin conductor 40'. More specifically, only when the inductive component 62 is connected with other electronic components or a circuit board, will the connecting conductor 40 as a whole be electrically connected with the pin conductor 40' indirectly via the other electronic components or the circuit board. Refer to FIGS. 4A, 4B, 4C and 4D together. In this embodiment, the pin conductor 40' has two pins 41, 45 disposed at two ends respectively on the outer surface of the inductive component 62. The pins 41, 45 act as pins of the inductive component 62 to electrically connect the inductive component 62 with any other components or carriers (e.g., a circuit board). Furthermore, the connecting conductor 40 may be designed in various forms according to practical requirements. In this embodiment, the connecting conductor 40 has a number of different conductor regions 42, 43, 44, 47, 48 wrapping and attaching on the first surface of a body of the inductive component 62. For instance, the conductor regions 42, 43, 44 act as power pins to connect to e.g. an FET switch, and the conductor regions 47, 48 act as signal pins to connect to e.g. a control IC. The conductor region 43 acting as a power pin has a large area and is spaced apart from the other conductor regions 42, 44, 47, 48 by a small spacing, so that the top surface (i.e., the surface oriented upwards in FIG. 4B) of the inductive component 62 is covered almost entirely by the conductor regions 42, 43, 44, 47 and 48 of the connecting conductor 40. As previously described, the connecting conductor 40 on the outer surface of the inductive component 62 has at least a portion thereof isolated from the pin conductor 40', i.e., no direct physical and electrical connection exists on the outer surface of the inductive component 62 between at least a portion of the connecting conductor 40 and the pin conductor 40'. More specifically, only when the inductive component 62 is connected with other electronic components or a circuit board, will the pin conductor 40' be electrically connected with the surface of at least a portion or total of the connecting conductor 40 indirectly via the other electronic components or the circuit board. Therefore, no direct electrical connection exists on the outer surface of the inductive component 62 between portions of the conductor regions 42, 43, 44, 47, 48 and the pins 41, 45 of the pin conductor 40'. Such a pin design of a large area may not only help to substantially enlarge a heat dissipation area of the first electronic component (i.e., the inductor) 62, but may also effectively improve the heat dissipation performance of an electronic apparatus as a whole (e.g., a power converter) using the inductive component 62. Typically, the pin conductor 40' of the first conductive layer 61 shown in FIG. 4A and FIG. 4B is made prior to the formation of the connecting conductor 40. Taking a wire wound inductor 140 as an example of the inductive component 62, a schematic diagram of the inductor 140 and a process for producing the pin conductor 40' of the inductor 140 are illustrated in FIGS. 14A to 14D. FIGS. 14A and 14B are a top view and a bottom view of an inductor made of a powder core through e.g. a compressing process; FIG. 14C depicts a profile of the inductor before coil pins are bent, and FIG. 14D depicts a structure of the coil inside the inductor. In more detail, the inductor 140 comprises a magnetic material portion 141 and an internal metal coil 142, with two ends of the internal metal coil 142 stretching out of the magnetic material portion 141 becoming the pin conductors 143 respectively. By wrapping the internal metal coil 142 with the power and compressing them together, the inductor 140 comes into being, and the pin conductors 143 at both ends of the internal metal coil 142 are bent and attached onto a second surface of the inductor 140.

On the other hand, the connecting conductor 40 of the first conductive layer 61 in this embodiment may be formed on an outer surface of the inductive component 62 in two primary methods. One method is to form the connecting conductor 40 onto a body surface of the inductive component 62 directly, and the second is to form the connecting conductor 40 independently before fixing it onto the first surface of the body of the inductive component 62. This will be detailed hereinafter.

For example, a specific method to form the connecting conductor 40 onto a body surface of the inductive component 62 directly may comprise the following steps: initially, a layer of conductive material such as copper is formed on the body surface of the inductive component 62 through a surface metallization process such as a chemical vapor deposition (CVD) or a physical vapor deposition (PVD), e.g., by evaporating, sputtering, or spraying a conductive material. Then, the conductive layer is exposed to light, patterned and developed to form the connecting conductor 40 on the first surface of the inductive component 62.

Figure 5A:
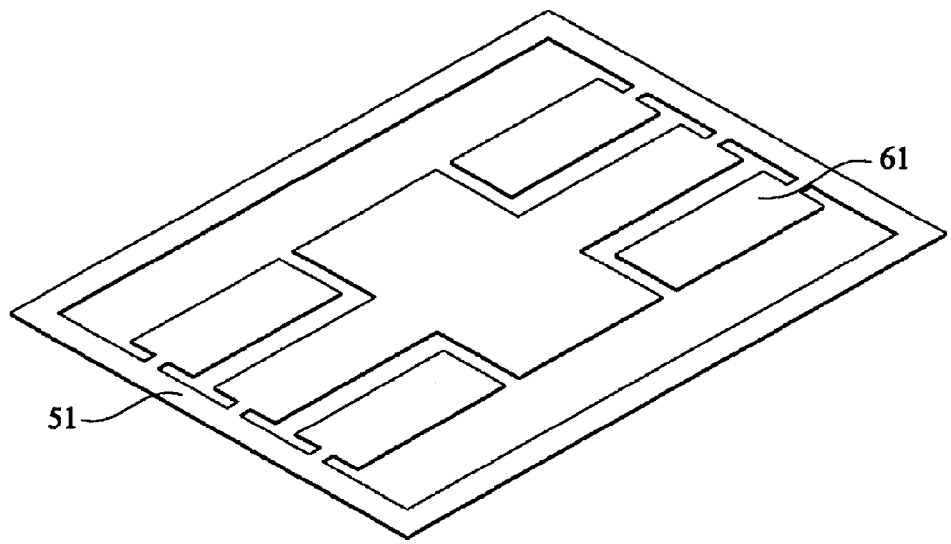
FIG. 5A to FIG. 5E illustrate results of individual steps in a process of wrapping the first electronic component with a first conductive layer in the DC to DC converter in accordance with the first embodiment of this invention.
Figure 5B:
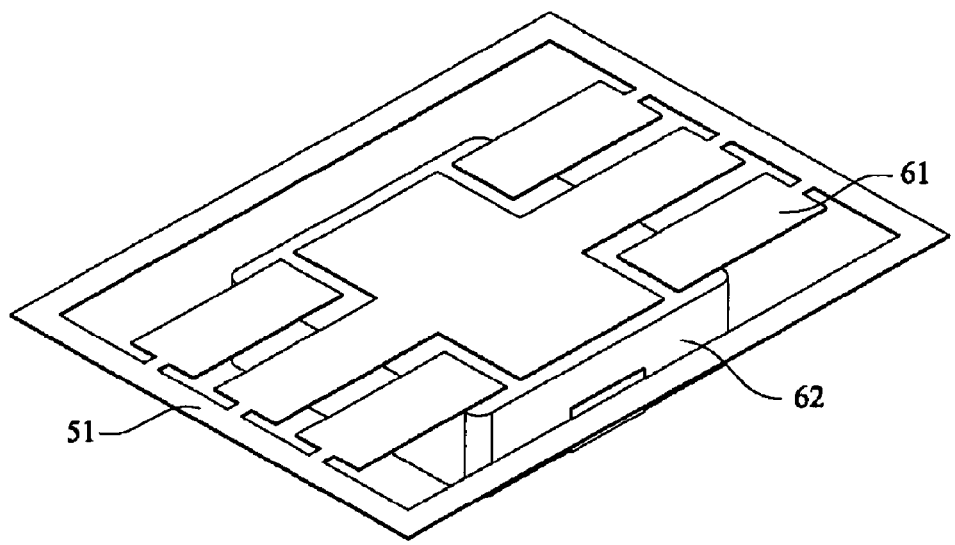
Figure 5C:
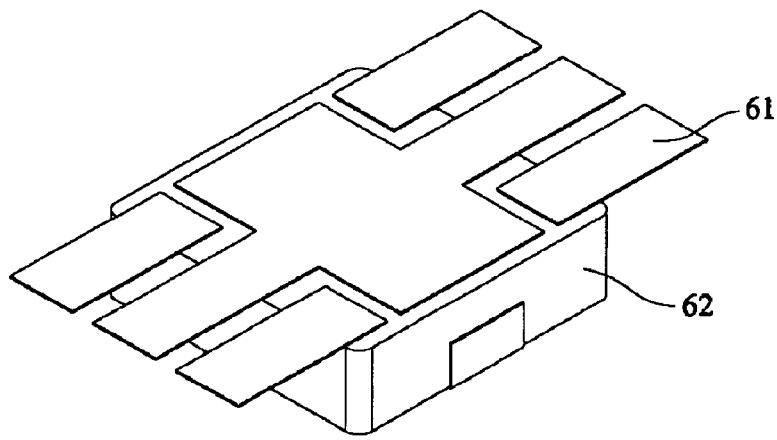

As shown in FIGS. 5A to 5E, the second method to form the first conductive layer 61 on a body surface of the inductive component 62 may be implemented in the following two ways. In a first way, a frame 51 comprising the first conductive layer 61 is made independently at first, as shown in FIG. 5A. Subsequently, as shown in FIG. 5B, the frame 51 is put into a mold for producing the inductive component 62 during a process of producing the inductive component 62, and then compressed into an outer surface of the inductive component 62 during a compressing process. After that, an excessive portion of the frame 51 is cut away and the remaining portion forms the first conductive layer 61 as shown in FIG. 5C. Then the first conductive layer 61 is bent in such a way that it wraps the first surface of the inductive component 62. Finally, an integrated structure 53 with a complete wrapped layer is formed.

In a second way, as shown in FIG. 5B, the first conductive layer 61 of the frame 51 is adhered to the first surface of the inductive component 62 through a kind of the adhesive e.g. a thermosetting adhesive. Subsequently, the frame 51 is bent in such a way that the first conductive layer 61 wraps the first surface of the inductive component 62. Finally, by performing a thermal process to thermoset the adhesive, the first conductive layer 61 is fixedly wrapped onto the first surface of the inductive component 62, thus an integrated structure 53 with a complete wrapped layer is formed.

Figure 5D:
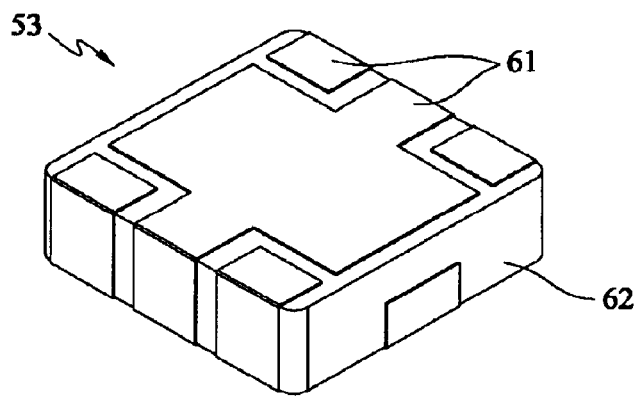
Figure 5E:
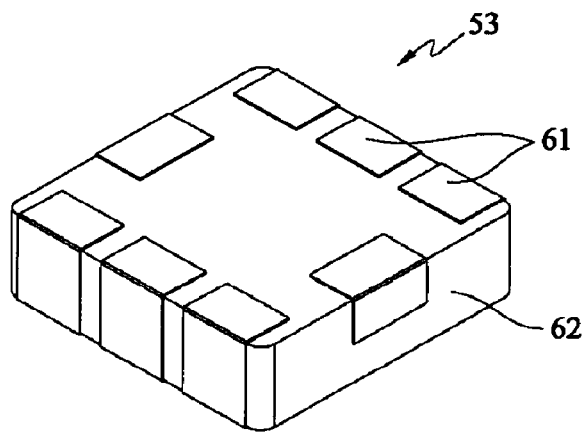

Furthermore, in the integrated structure 53 obtained by the aforesaid method of this invention, a maximum spacing between the first conductive layer 61 and the inductive component 62 is less than 0.3 mm which is good to the thermal conduction performance, small volume or easy application of the production method such as a chemical vapor deposition (CVD) or a physical vapor deposition. FIGS. 5D and 5E illustrate a bottom view and a top view respectively of the integrated structure 53 where the frame 51 is bent to wrap the inductive component 62.

Figure 6A:
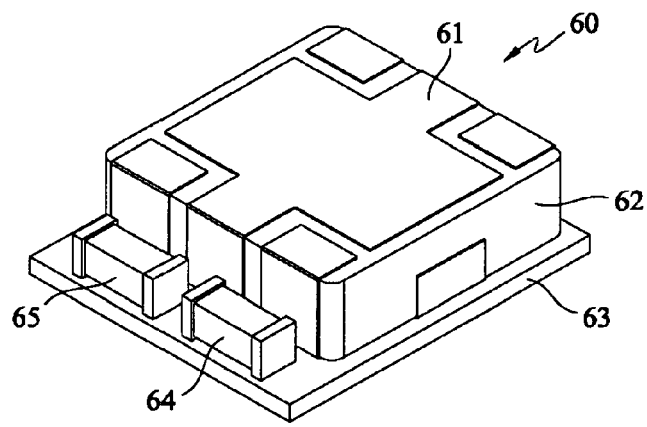
FIG. 6A is a bottom view of a DC to DC converter in accordance with the first embodiment of this invention.
Figure 6B:
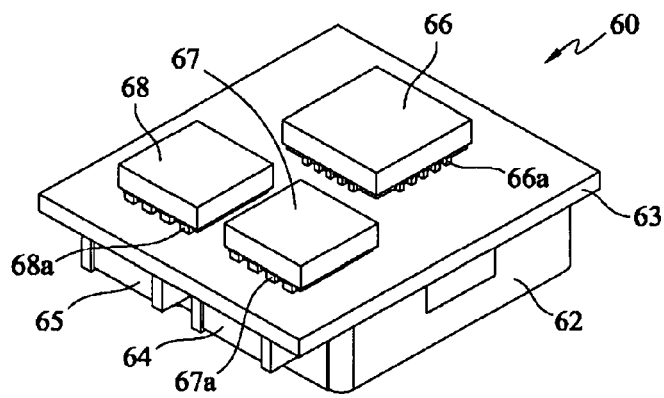
FIG. 6B is a top view of a DC to DC converter in accordance with the first embodiment of this invention.
Figure 6C:
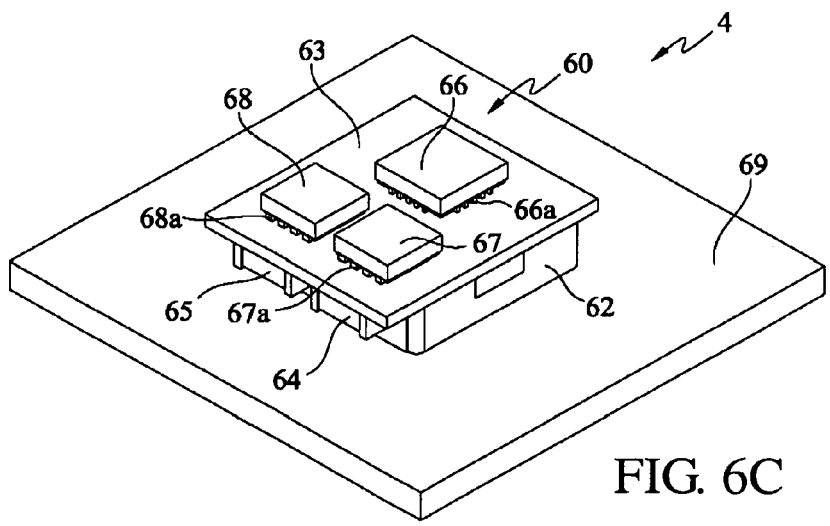
FIG. 6C is a top view of an assembled circuit incorporating a DC to DC converter in accordance with the first embodiment of this invention.

Referring to FIGS. 6A, 6B and 6C, a particular application of the first embodiment of this invention is illustrated therein. FIGS. 6A and 6B illustrate a top view and a bottom view of a DC to DC converter respectively, and FIG. 6C illustrates a top view of an assembled circuit incorporating this DC to DC converter. The aforesaid inductive component 62 having large-area pins is applied in the DC to DC converter 60 shown in FIGS. 6A and 6B, and the DC to DC converter 60 may be e.g. a point of load (POL) buck converter. The assembled circuit 4 shown in FIG. 6C is a circuit structure adopting the DC to DC converter 60, and will be described in detail hereinafter.

As shown, the assembled circuit 4 in this embodiment comprises a first and a second carrier for supporting electronic components, e.g., a first circuit board 69 and a second circuit board 63. The assembled circuit 4 further comprises the aforesaid DC to DC converter 60 and the first circuit board 69 wherein the aforesaid DC to DC converter 60 comprises an inductive component 62, a first conductive layer 61, a first electronic component 66, two second electronic components 64, 65, and two third electronic components 67, 68. In this embodiment, the inductive component 62, the first electronic component 66, the second electronic components 64, 65, and the third electronic components 67, 68 are an inductor, a control chip, capacitors and FETs respectively. However, in other aspects, each of the electronic components may be one of an inductor, a resistor, a capacitor, an FET, a control chip, and an integrated circuit (IC) etc.; wherein the IC may be formed by integrating e.g. at least two of an inductor, a resistor, a capacitor, an FET, and a control chip etc. The FETs serving as the third electronic components 67, 68 are also known as a switch element or a power element, and may be e.g. metal oxide semiconductor field-effect transistors (MOSFETs), IGBT etc.

Referring to FIGS. 6A, 6B and 6C, the first circuit board 69 is electrically connected with the DC to DC converter 60 through the connecting conductor 40 wrapping the first surface of the inductive component 62. The first electronic component 66 is also electrically connected with the connecting conductor 40. More specifically, the first electronic component 66 is electrically connected with the connecting conductor 40 via the second circuit board 63.

As shown in FIGS. 6A and 6B, the inductive component 62, the first electronic component 66, the second electronic components 64, 65, and the third electronic components 67, 68 are mounted on the second circuit board 63 to form the DC to DC converter 60. More specifically, the second circuit board 63 is generally a printed circuit board (PCB) having two opposite sides. On one side of the second circuit board 63 are mounted the inductive component 62 wrapped with the first conductive layer 61 and the second electronic components 64, 65, and on the other side are mounted the first electronic component 66 and the third electronic components 67, 68, as shown in FIG. 6B. FIG. 6C is a perspective view of the assembled circuit 4 formed by mounting the DC to DC converter 60 having the integrated structure 53 onto the first circuit board 69. As shown, the DC to DC converter 60 is mounted on the first circuit board 69 by means of the conductive regions 42, 43, 44, 47, 48 acting as pins in the connecting conductor 40 that wraps the inductive component 62.

Since the conductor regions 42, 43, 44, 47, 48 of the connecting conductor 40 of the inductive component 62 are distributed on the outer surface of the inductive component 62, the DC to DC converter 60 is adapted to be electrically connected with the first circuit board 69 via the conductor regions 42, 43, 44, 47, 48 of the connecting conductor 40 of the inductive component 62. As a result, when being installed onto the first circuit board 69, the DC to DC converter 60 occupies less space on the first circuit board 69. On the other hand, since when the DC to DC converter 60 is installed onto the first circuit board 69, it is the body of the inductive component 62 not the circuit board 63 that serves the mechanical support for the entire DC to DC converter 60, thus in practical use the thickness needed of the second circuit board 63 can be remarkably reduced. In this way, a space saving is achieved in the DC to DC converter 60 and even in the assembled circuit 4 as a whole, which effectively improves the power density of the DC to DC converter 60.

Additionally, as the first electronic component 66 and the third electronic components 67, 68 are the main heat-generating components, the overall heat dissipation performance of the DC to DC converter 60 can be enhanced by dissipating heat from the pin 66a of the first electronic component 66 and the pins 67a, 68a of the third electronic components 67, 68 to the ambient through the first conductive layer 61 and the thinner second circuit board 63 which has better thermal conduction performance.

Figure 7A:
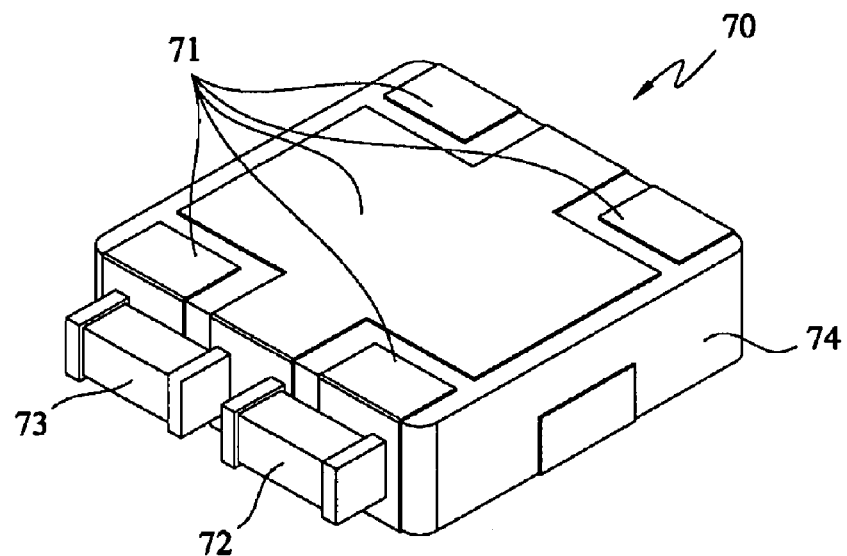
FIG. 7A is a top view illustrating a connection between a second electronic component and a first conductive layer in a DC to DC converter in accordance with a second embodiment of this invention.
Figure 7B:
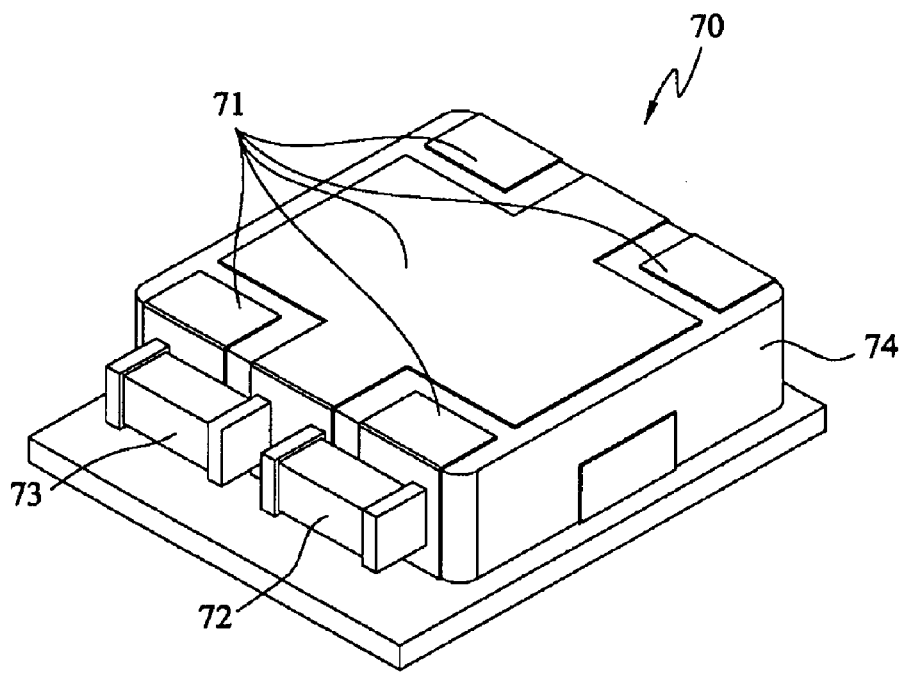
FIG. 7B is a top view of a DC to DC converter in accordance with the second embodiment of this invention.

The above description relates to a practical application of this invention, which may vary according to practical requirements. For example, a second embodiment of this invention to be described applies the similar structure to an assembled circuit of a DC to DC converter 70, as shown in FIGS. 7A and 7B. The second embodiment differs from the first embodiment in that, the second electronic components 64, 65 of the first embodiment are electrically connected at first to the second circuit board 63 and then electrically connected to the connecting conductor 40 of the first conductive layer 61 via the second circuit board 63; in contrast, the second electronic components 72, 73 of the second embodiment make a physical and electrical connection directly with the connecting conductor 71 on an outer surface of the inductive component 74. More specifically, the second electronic components 72, 73 are mounted directly onto the connecting conductor 71 as shown in FIG. 7A. A perspective view illustrating a structure of the DC to DC converter 70 connected in the aforementioned way is shown in FIG. 7B.

It should be noted that, this embodiment adopts a structure where the first conductive layer 71 wraps a surface of the first electronic component (i.e., an inductor) 74. However, in other examples of this embodiment, the first conductive layer 71 may instead be wrapped on a surface of the first electronic component (not shown) or the third electronic component (not shown) previously described, and then the second electronic components (i.e., capacitors) 72, 73 are attached directly onto the first conductive layer 71 that wraps the surface of the first electronic component or the third electronic component. This may accomplish the same goal as that described above of improving the power density and shrinking the volume.

Figure 11A:
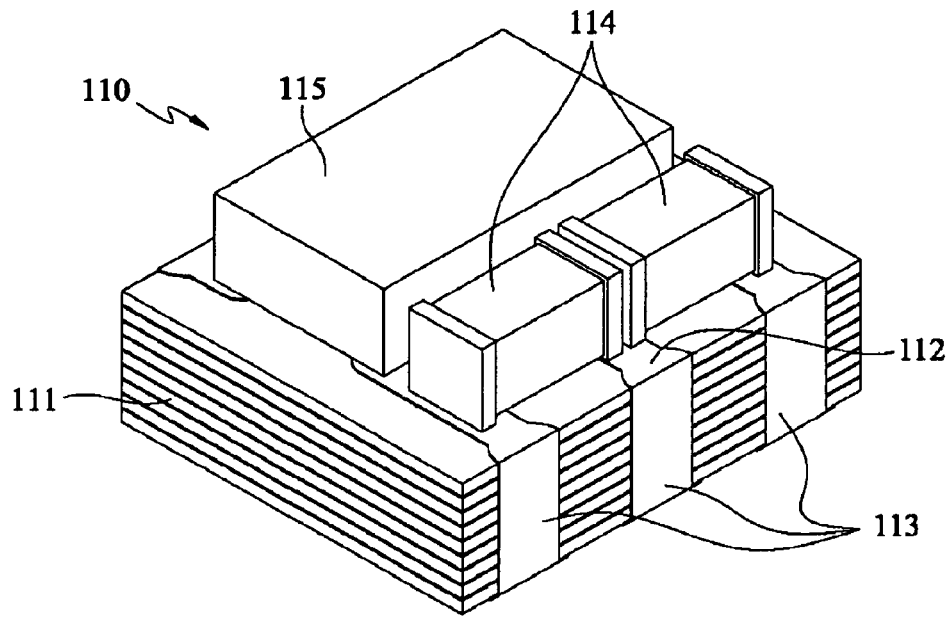
FIG. 11A is a top view of a POL DC to DC converter in accordance with a third embodiment of this invention.
Figure 11B:
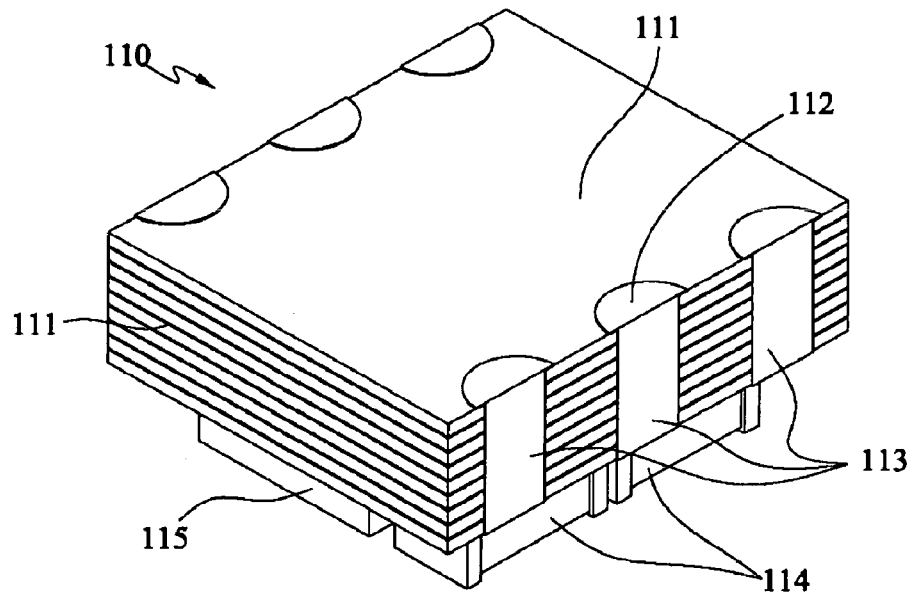
FIG. 11B is a bottom view of the POL DC to DC converter in accordance with the third embodiment of this invention.

FIGS. 11A to 11G illustrate a third embodiment of this invention, which also relates to an assembled circuit applied to a DC to DC converter, and particularly a POL DC to DC converter. FIGS. 11A and 11B illustrate a top view and a bottom view of the POL DC to DC converter 110 respectively. The POL DC to DC converter 110 adopts an inductor made of a co-fired magnetic material as a substrate. The POL DC to DC converter 110 comprises an inductive component, a first conductive layer 112, two second electronic components, a fourth electronic component and an inductance coil 116. In this embodiment, the inductive component is formed by stacking a number of co-fired magnetic material substrates 111 together, the second electronic components are capacitors 114, and the fourth electronic component is an integrated circuit (IC) 115 integrating e.g. an FET (particularly an MOSFET) and a control chip together. As previously described, the first conductive layer 112 comprises a connecting conductor and a pin conductor. In this embodiment, the connecting conductor has four pins 118 and a conductor 113 connected therewith, and the pin conductor has two pins 117 and a conductor 113 connected therewith. The first conductive layer 112 wraps a first surface of the outer surface of the stacked co-fired magnetic material substrate 111. The first surface comprises a top surface, a bottom surface and side surfaces. More specifically, the side surfaces are wrapped by the conductors 113. The first conductive layer 112 on the top surface provides electrical connections between the capacitors 114, the IC 115 and the like. When being mounted onto a carrier (which is a main circuit board here and not shown), the assembled circuit may be electrically connected with the carrier via the first conductive layer 112 of the bottom surface. On the other hand, the conductors 113 wrapping the side surfaces function to electrically connect the first conductive layer 112 on the top surface with that on the bottom surface.

Figure 11C:
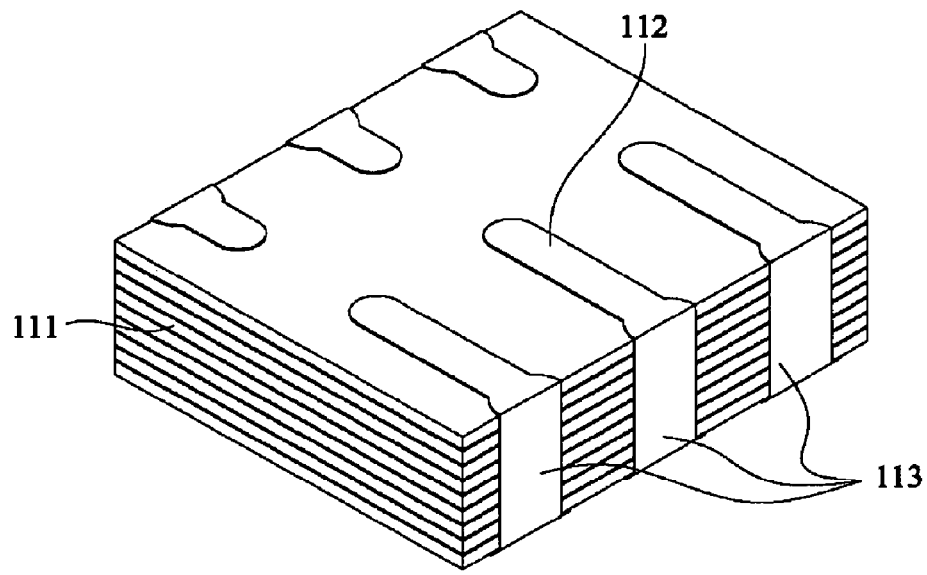
FIG. 11C is a schematic view illustrating a co-fired magnetic material substrate, a first conductive layer and a conductor in accordance with the third embodiment of this invention.
Figure 11D:
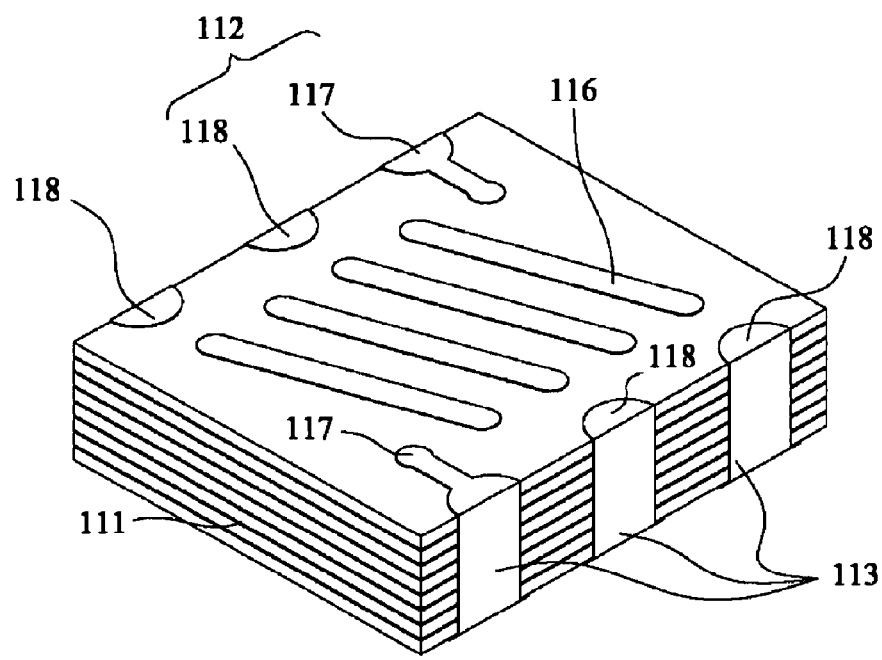
FIG. 11D is a schematic view illustrating the co-fired magnetic material substrate in accordance with the third embodiment of this invention with a first magnetic material layer being removed.
Figure 11E:
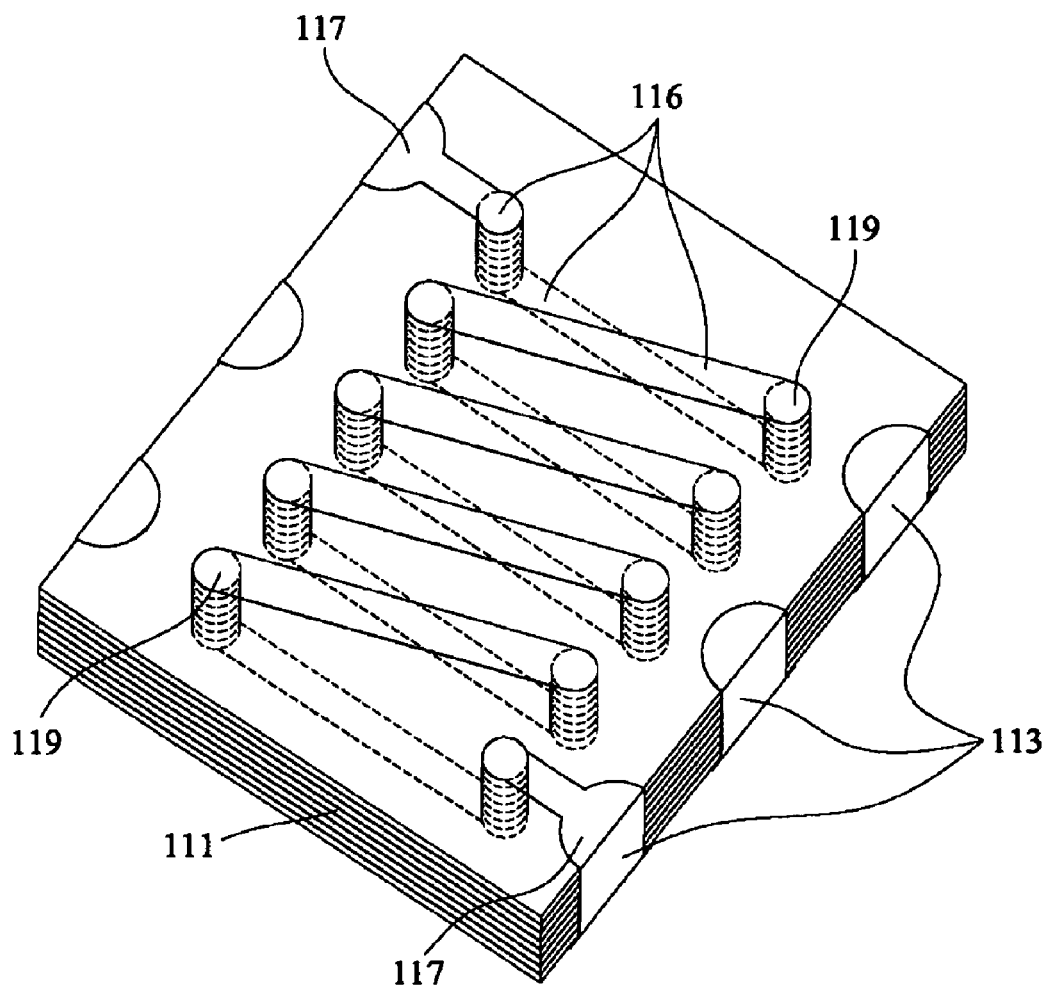
FIG. 11E is a perspective view of an internal structure corresponding to FIG. 11C.

In more detail, the co-fired magnetic material inductor 111 is formed by sintering multiple layers of magnetic material together, which is a process similar to the low temperature co-fired ceramic (LTCC) process. As shown in FIG. 11E, the inductance coil 116 comprises a plurality of connecting conductive elements 119, which are formed in the following way. At first, a number of through-holes are formed in each middle magnetic material layer in such a way that corresponding through-holes on these layers will substantially superposed with each other after the magnetic material layers are stacked together in parallel. In a similar way, a number of semi-circular through-holes are formed at two opposite sides of each magnetic material layer, and are filled with a metal material such as silver (Ag), palladium (Pd), gold (Au) or copper (Cu) to form the connecting conductive elements 119 and the pins 117, 118 of the inductance coil 116. A number of conductors are made on a top surface of the uppermost magnetic material layer and a bottom surface of the lowermost magnetic material layer, with each of the conductors connecting two through-holes in the magnetic material layer. Finally, the multiple magnetic material layers are laminated together to form the inductance coil 116 and a portion of the first conductive layer 113, with the inductance coil 116 being electrically connected to the pins 117 of the pin conductor.

Figure 11F:
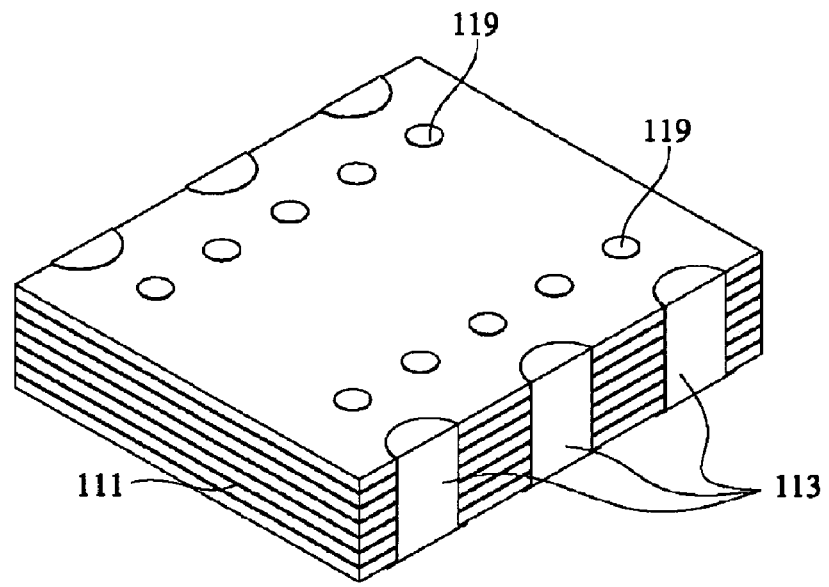
FIG. 11F is a schematic view illustrating internal circuit layers of the co-fired magnetic material substrate other than a first layer, a second layer and the last layer in accordance with the third embodiment of this invention.
Figure 11G:
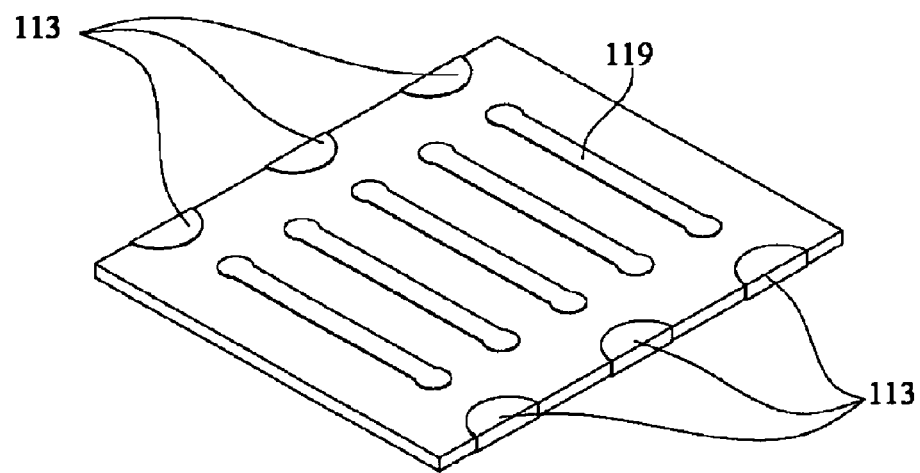
FIG. 11G is a schematic view of the last circuit layer in the co-fired magnetic material substrate in accordance with the third embodiment of this invention.

Subsequently, a magnetic material layer is stacked on or an insulation material layer is applied to each of the top surface and the bottom surfaces of the completed inductor. Then, semi-circular through-holes are formed in the magnetic material layers or the insulation material layers and filled with a metal material to form the co-fired magnetic material substrate 111. A first conductive layer 112 is formed on a surface of the co-fired magnetic material substrate 111 to connect with electronic components (e.g., the capacitors 114 and the IC 115 having an FET and a control chip integrated together) mounted on the substrate 111. Thus, a complete POL DC to DC converter 110 as shown in FIGS. 11A and 11B is formed. FIG. 11C is a schematic view of the co-fired magnetic material substrate 111 and the first conductive layer 112. FIG. 11D is a schematic view of the co-fired magnetic material substrate 111, with its first layer removed to show the electrical connection between the inductance coil 116 inside the co-fired magnetic material substrate 111 and the pins. FIG. 11E is a perspective view illustrating an internal structure corresponding to FIG. 11D. The winding direction of the inductance coil 116 is visible in this figure, and it is clear that the pins 117 are connected with the inductance coil 116. FIG. 11F is a schematic view illustrating internal circuits of the co-fired magnetic material substrate 111 other than the first layer, the second layer and the last layer. FIG. 11G is a schematic view of the last circuit layer in the co-fired magnetic material substrate 111. It can be seen from these figures that, the connecting conductor on the outer surface of the co-fired magnetic material substrate 111 are at least partially or entirely isolated from the pin conductor, i.e., there exists no direct physical and electrical connection on the outer surface between at least a portion or the entirety of the connecting conductor and the pin conductor. More specifically, at least a portion or the entirety of the connecting conductor is indirectly connected with the pin conductor. That is, only when the co-fired magnetic material substrate 111 is stacked with other electronic components such as the capacitors 114 and the IC 115 thereon, will the pin 118 of the connecting conductor be electrically connected with the pin 117 of the pin conductor indirectly via the other electronic components.

Figure 12A:
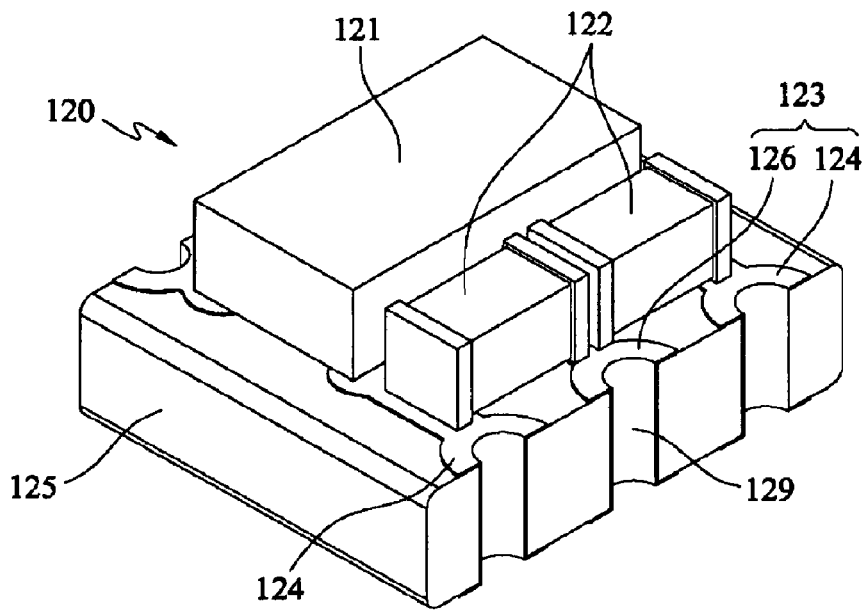
FIG. 12A is a top view of a POL DC to DC converter in accordance with a fourth embodiment of this invention.
Figure 12B:
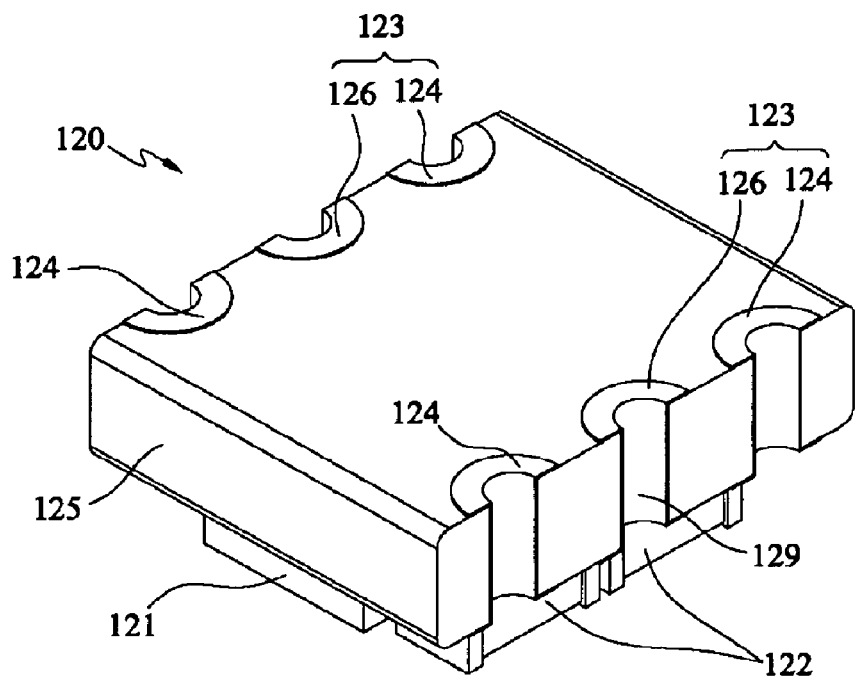
FIG. 12B is a bottom view of a POL DC to DC converter in accordance with the fourth embodiment of this invention.

FIGS. 12A to 12D illustrate a fourth embodiment of this invention, which also relates to an assembled circuit applied to e.g. a DC to DC converter, and particularly a POL DC to DC converter 120. FIGS. 12A and 12B illustrate a top view and a bottom view respectively of the POL DC to DC converter 120 where an inductance coil 127 is compressed in a magnetic material substrate 125. The POL DC to DC converter 120 comprises a fourth electronic component, two second electronic components, a first conductive layer 123, and an inductive component. The fourth electronic component is an integrated circuit (IC) 121 having e.g. an FET (particularly an MOSFET) and a control chip integrated therein, the two second electronic components are both capacitors 122, and the inductive component comprises the magnetic material substrate 125 and the inductance coil 127 described above. As previously described, the first conductive layer 123 comprises a connecting conductor having four pins 124 and a pin conductor having two pins 126. Each of the pins 124 of the connecting conductor and the pins 126 of the pin conductor has a conductor 129.

Figure 12C:
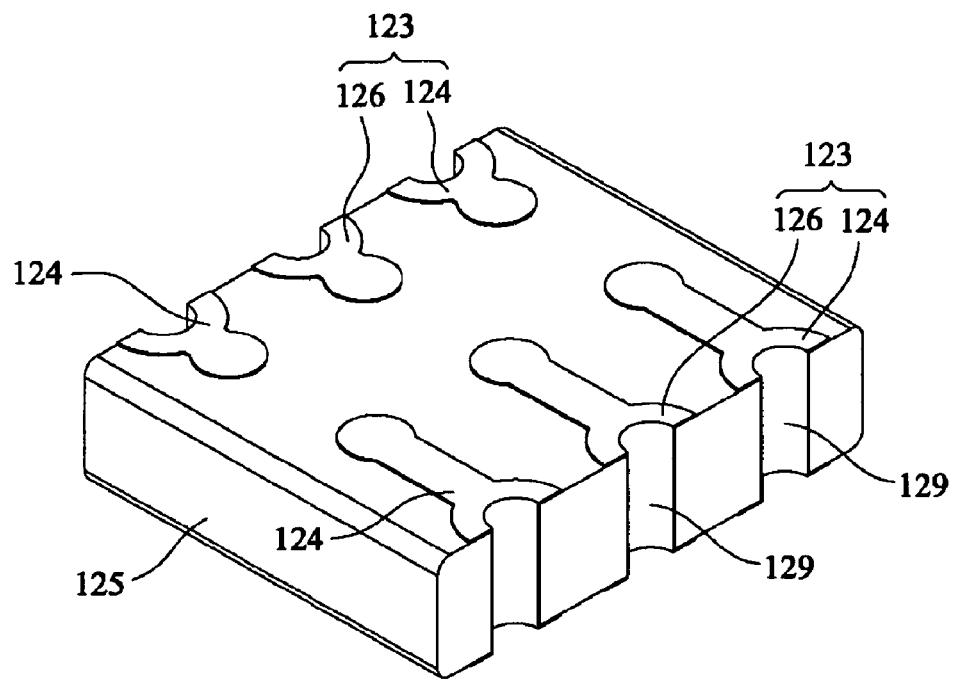
FIG. 12C is a schematic view illustrating a substrate made of a magnetic material, a first conductive layer and a conductor in accordance with the fourth embodiment of this invention.
Figure 12D:
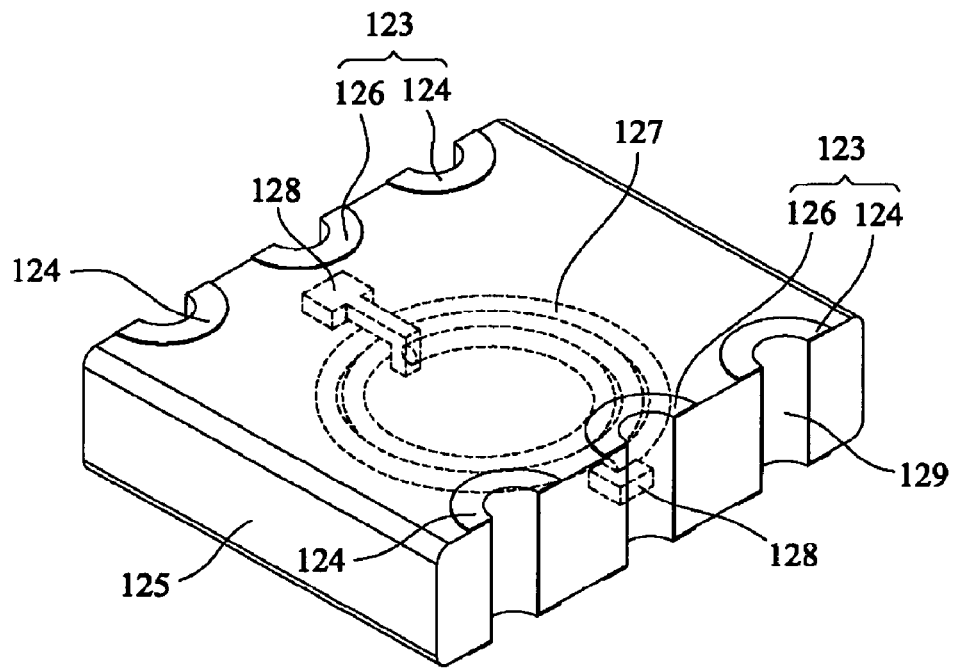
FIG. 12D is a perspective view of an internal structure corresponding to FIG. 12C.

The first conductive layer 123 wraps a first surface of the outer surface of the magnetic material substrate 125. The first surface comprises a top surface, a bottom surface and side surfaces. More specifically, the side surfaces are wrapped by the conductors 129 of the first conductive layer 123. The IC 121 and the capacitors 122 are directly attached onto the first conductive layer 123, and make direct contact therewith to establish an electrical connection. More specifically, the conductors 129 are formed in a through-hole form through the top and the bottom surfaces of the magnetic material substrate 125, in order to establish an electrical connection between the top and the bottom surfaces of the magnetic material substrate 125. When being mounted onto a carrier (e.g. a main circuit board here and not shown), the assembled circuit may be electrically connected with the carrier via the first conductive layer 123. Meanwhile, the conductor 129 in the two pins 126 of the pin conductor are electrically connected with the flat coil pins 128 at both ends of the inductance coil 127 inside the magnetic material substrate 125. FIG. 12C is a schematic view of the magnetic material substrate 125, the first conductive layer 123 and the conductors 129. FIG. 12D is a perspective view illustrating an internal structure corresponding to FIG. 12C; as shown in this figure, the coil pins 128 at both ends of the inductance coil 127 are connected with the conductors 129 of the pins 126 of the pin conductor.

As in the third embodiment, the inductance coil 127 has been compressed into the magnetic material substrate 125 when the substrate 125 is produced. Furthermore, as previously described and as can be seen from the figures, the pins 124 of the connecting conductor are at least partially or entirely isolated from the pins 126 of the pin conductor. In other words, there exists no direct physical and electrical connection on the outer surface between at least a portion or the entirety of the pins 124 of the connecting conductor and the pins 126 of the pin conductor.

Figure 13A:
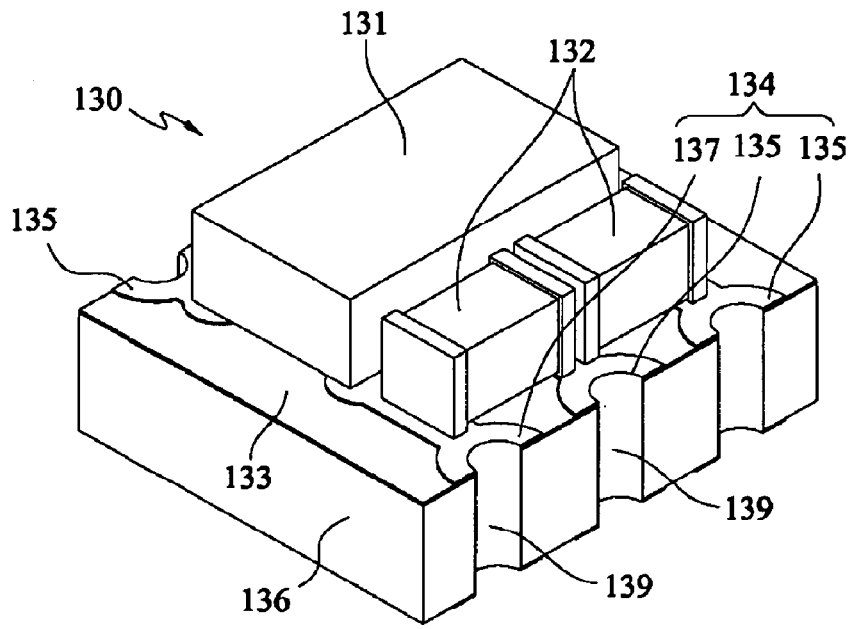
FIG. 13A is a top view of a POL DC to DC converter in accordance with a fifth embodiment of this invention.
Figure 13B:
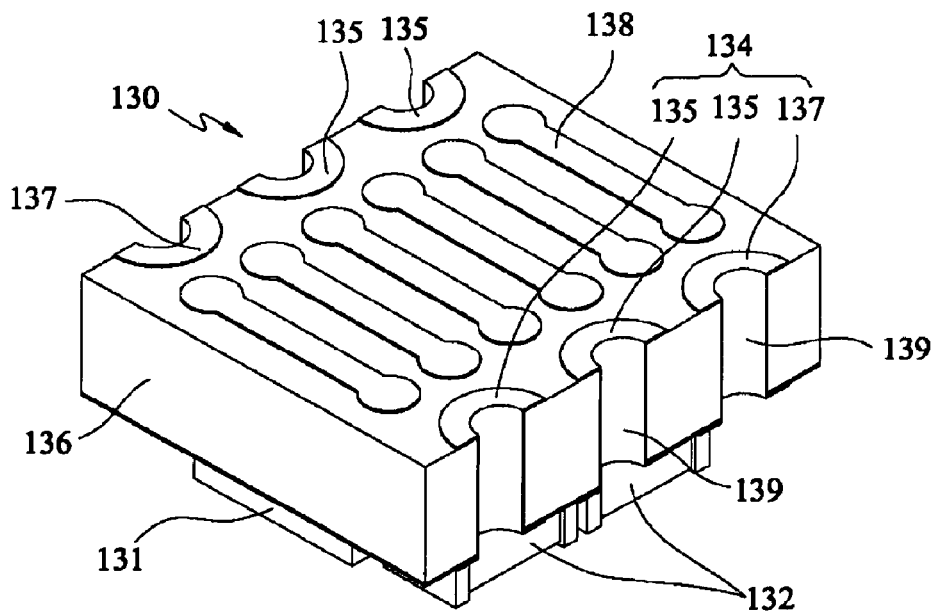
FIG. 13B is a bottom view of a POL DC to DC converter in accordance with the fifth embodiment of this invention.

FIGS. 13A to 13F illustrate a fifth embodiment of this invention, which still relates to an assembled circuit applied to a DC to DC converter e.g. a POL DC to DC converter. FIGS. 13A and 13B illustrate a top view and a bottom view respectively of the POL DC to DC converter 13 where an inductance coil 138 is made via through holes in a magnetic material substrate 136. The POL DC to DC converter 130 comprises a fourth electronic component, two second electronic components, an insulating layer 133, a first conductive layer 134 and an inductive component. The fourth electronic component is an IC 131 having e.g. an FET (particularly an MOSFET) and a control chip integrated therein; the two second electronic components are both capacitors 132; and the inductive component comprises the magnetic material substrate 136 and the inductance coil 138 described above. The first conductive layer 134 comprises a connecting conductor having four pins 135 and a pin conductor having two pins 137. Each of the pins 135 of the connecting conductor and the pins 137 of the pin conductor has a conductor 139.

The first conductive layer 134 wraps a first surface of the outer surface of the magnetic material substrate 136. The first surface comprises a bottom surface and side surfaces. More specifically, the side surfaces are wrapped by the conductors 139 of the first conductive layer 134. Additionally, the first conductive layer 134 further wraps the insulating layer 133 disposed on a top surface of the magnetic material substrate 136. The IC 131 and the capacitors 132 are directly attached onto a top surface of the magnetic material substrate 136, and make direct electrical contact therewith the first conductive layer 134. More specifically, the conductors 139 are formed in a through-hole form through the top and the bottom surfaces of the magnetic material substrate 136, in order to establish an electrical connection across the top and the bottom surfaces of the magnetic material substrate 136. As previously described, the insulating layer 133 is interposed between the first conductive layer 134 and the magnetic material substrate 136 to provide insulation therebetween.

Figure 13C:
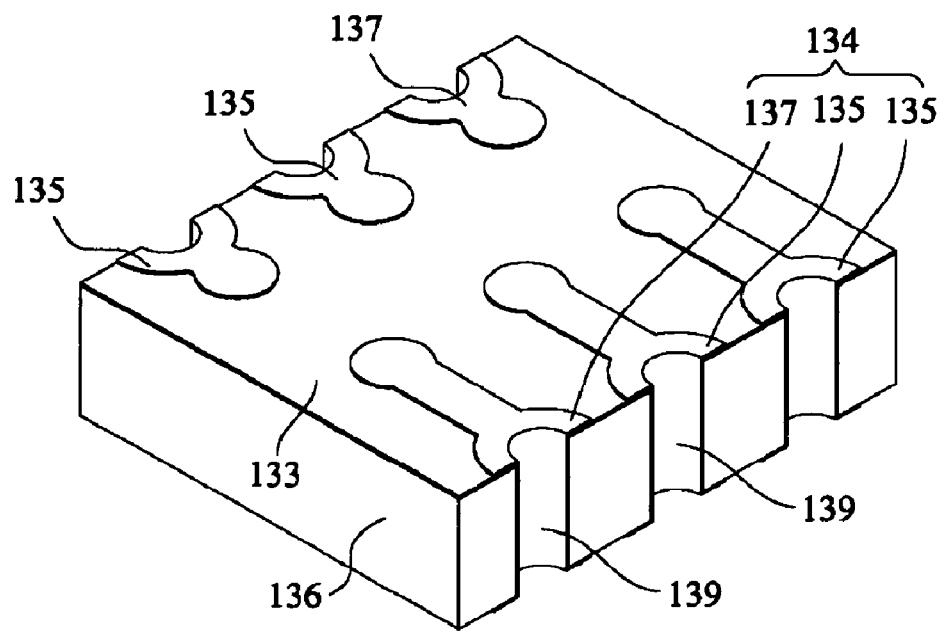
FIG. 13C is a schematic view illustrating a magnetic material substrate, a first conductive layer, an insulating layer and a conductor in accordance with the fifth embodiment of this invention.
Figure 13D:
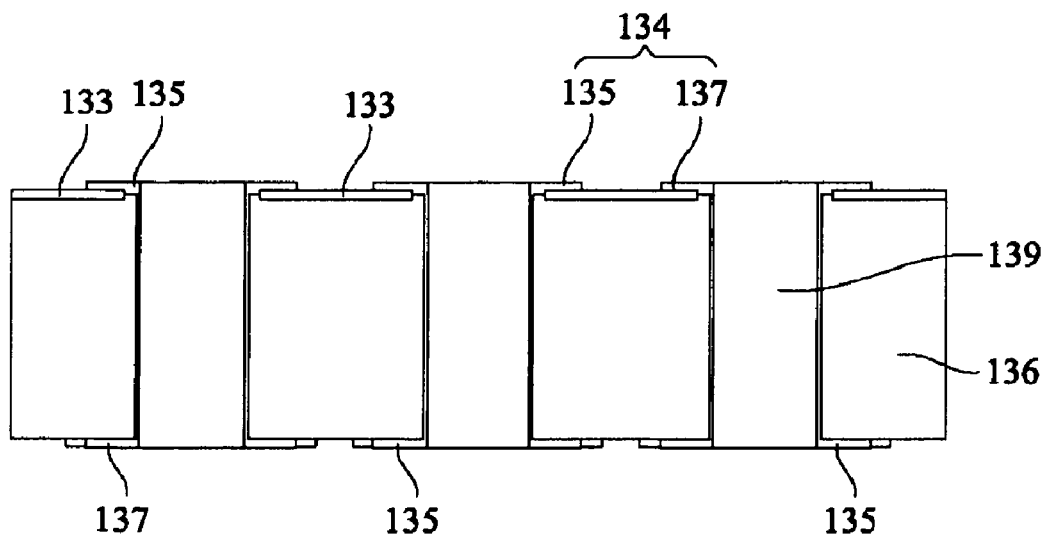
FIG. 13D is a side view of FIG. 13C.
Figure 13E:
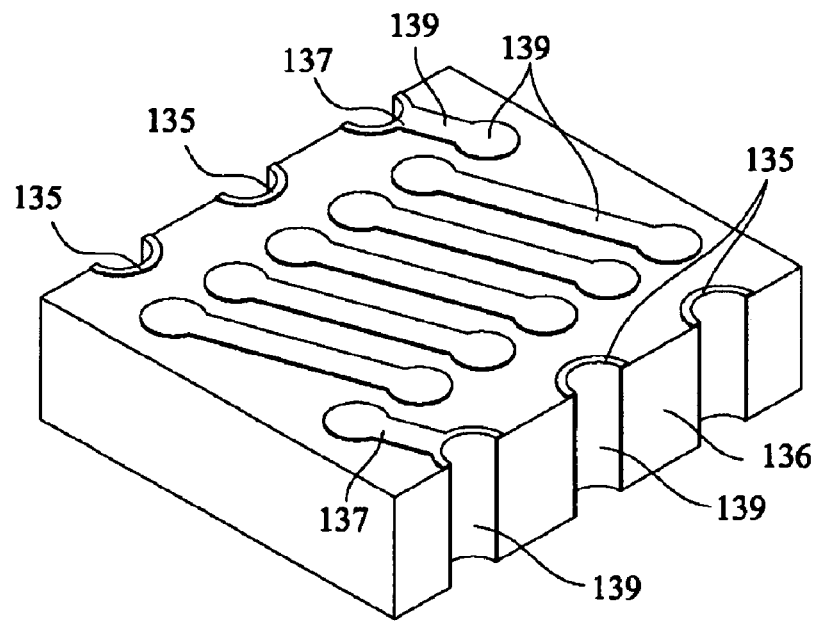
FIG. 13E is a schematic view of the magnetic material substrate in accordance with the fifth embodiment of this invention without an insulating layer being covered thereon.
Figure 13F:
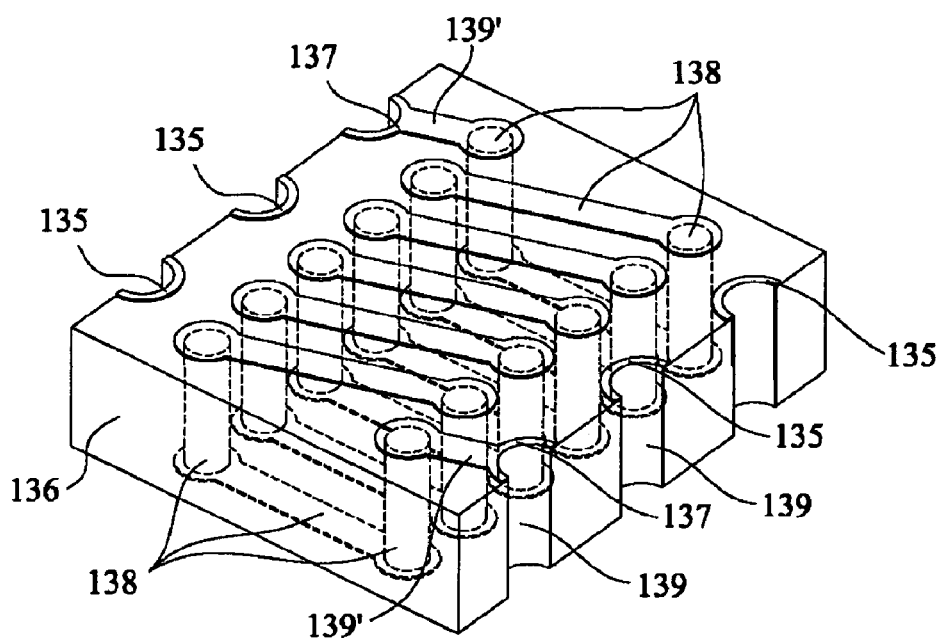
FIG. 13F is a perspective view of an internal structure corresponding to FIG. 13E.

When being mounted onto a carrier (which is a main circuit board here and not shown), the assembled circuit may be electrically connected with the carrier via the first conductive layer 134. FIG. 13C is a schematic view of the magnetic material substrate 136, the first conductive layer 134, the insulating layer 133 and the conductors 139, and FIG. 13D is a side view corresponding to FIG. 13C. FIG. 13E is a schematic view of the magnetic material substrate 136 without the insulating layer 133 being covered thereon; FIG. 13F is a perspective view illustrating an internal structure corresponding to FIG. 13E, in which the winding direction is visible. As shown in this figure, the two connecting conductive elements 139' of the two pins 137 are both adapted to connect the inductance coil 138 with the conductor 139.

This embodiment may be implemented in the following way. Through-holes are drilled in the magnetic material substrate 136 and electro-plated to form an inductance coil 138. Then an adhesive insulating layer 133 is coated on a top surface of the magnetic material substrate 136, and a first conductive layer 134 is laminated onto the surface of the magnetic material substrate 136. Subsequently, through-holes are drilled and electro-plated to obtain the conductors 139. This process is just similar to a manufacturing process of a PCB.

Furthermore, as previously described and as can be seen from the figures, the pins 135 of the connecting conductor are at least partially or entirely isolated from the pins 137 of the pin conductor. In other words, there exists no direct physical and electrical connection on the outer surface between at least a portion or the entirety of the pins 135 of the connecting conductor and the pins 137 of the pin conductor; rather, they are indirectly connected via the circuit board or other electronic components such as the IC 131 and the capacitors 132.

To summarize, the third to the fifth embodiments all utilize the magnetic material of the inductor as a substrate of the entire POL DC to DC converter. The magnetic material substrate acting as a body of the inductive component has a first conductive layer wrapped on a top surface thereof to electrically connect various electronic components. The electronic component may be e.g. one of an inductor, a resistor, a capacitor, an FET, a control chip, and an integrated circuit (IC) etc.; and furthermore, the IC may be formed by integrating e.g. at least two of an inductor, a resistor, a capacitor, an FET, and a control chip etc. An electrical connection between the electronic component and the first conductive layer may be implemented by the surface mounting technology, wire bonding or the like technologies. The input/output (I/O) terminals for electrical signals of the POL DC to DC converter, i.e., pins of the POL DC to DC converter are disposed on the bottom surface of the inductor, which are adapted to be soldered onto a circuit board (i.e., the first carrier in the previous embodiments). Both the top and the bottom surfaces of the inductor are connected via conductors of the first conductive layer. It should be emphasized that, if such electronic components such as capacitors and resistors are integrated in the POL DC to DC converter, it will be more advantageous for alleviating influence imposed by parasitic parameters inside the POL DC to DC converter, thus resulting in better electrical performance.

Figure 8A:
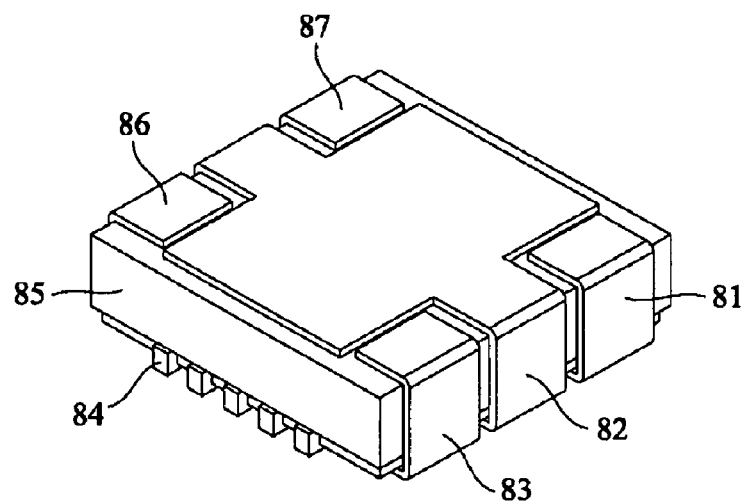
FIG. 8A is a top view of a second electronic component wrapped with a first conductive layer in a DC to DC converter in accordance with a sixth embodiment of this invention.
Figure 8B:
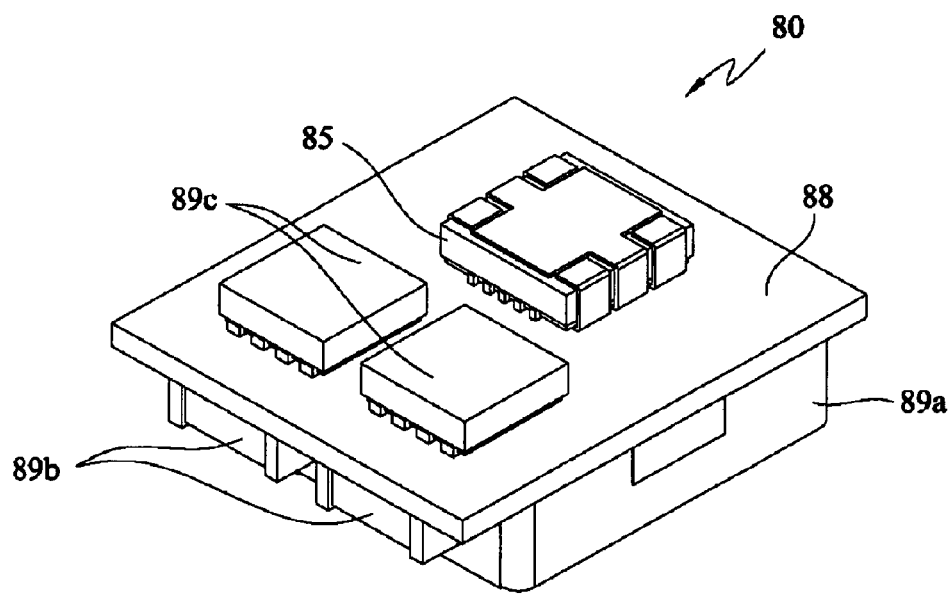
FIG. 8B is a top view of a DC to DC converter in accordance with the sixth embodiment of this invention.
Figure 9A:
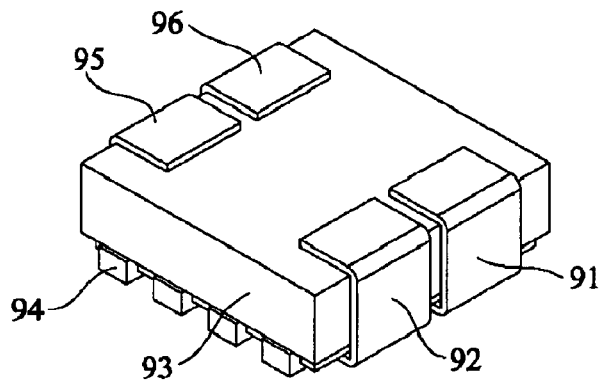
FIG. 9A is a top view of a fourth electronic component wrapped with a first conductive layer in a DC to DC converter in accordance with a seventh embodiment of this invention.
Figure 9B:
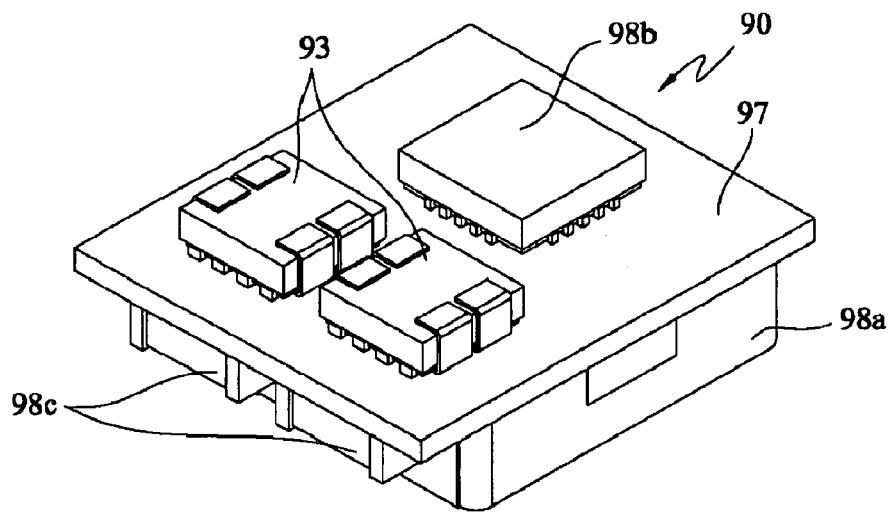
FIG. 9B is a top view of a DC to DC converter in accordance with the seventh embodiment of this invention.

FIGS. 8A and 8B illustrate a sixth embodiment of this invention, which also applies the characteristics described in the first embodiment to a DC to DC converter. Also, in this embodiment, a DC to DC converter 80 may be connected to a first carrier (which is a circuit board herein and not shown). The DC to DC converter 80 of this embodiment comprises a second carrier, an inductive component 89a, a first electronic component 85, two second electronic components 89b, and two third electronic components 89c. The second carrier may be, for example, a second circuit board 88. Similar to the first embodiment, the first electronic component 85 also has a first conductive layer wrapped on a surface thereof to provide an electrical connection between the DC to DC converter and the first carrier. The first conductive layer comprises a connecting conductor and a pin conductor 84, in which the connecting conductor further has a number of pins 81, 82, 83, 86, 87. In this embodiment, the inductive component 89a, the first electronic component 85, the second electronic components 89b and the third electronic components 89c are an inductor, a control chip, capacitors and FETs respectively. A seventh embodiment of this invention also applies the aforesaid characteristics to a DC to DC converter 90. As shown in FIGS. 9A and 9B, in this embodiment, the DC to DC converter 90 may also be connected to a first carrier (which is a circuit board herein and not shown). The DC to DC converter 90 comprises a second carrier, an inductive component 98a, a first electronic component 98b, two second electronic components 98c, and two third electronic components 93. The second carrier is a second circuit board 97. Similar to the sixth embodiment, the third electronic components 93 has a first conductive layer wrapped on a surface thereof to provide an electrical connection between the DC to DC converter and the first carrier. The first conductive layer comprises a connecting conductor and a pin conductor 94, in which the connecting conductor further has a number of pins 91, 92, 95, 96. In this embodiment, the inductive component 98a, the first electronic component 98b, the second electronic components 98c and the third electronic components 93 are an inductor, a control chip, capacitors and FETs respectively.

Figure 10:
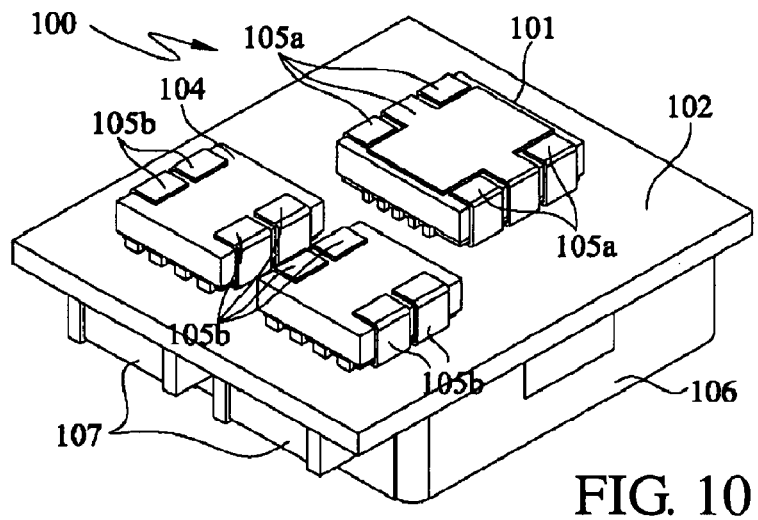
FIG. 10 is a top view of a DC to DC converter in accordance with an eighth embodiment of this invention.

An eighth embodiment of this invention is shown in FIG. 10. Similarly in this embodiment, a DC to DC converter 100 comprises a second carrier, an inductive component 106, a first electronic component 101, two second electronic components 107, and two third electronic components 103, 104. In this embodiment, the second carrier is a second circuit board 102. Similar to the previous embodiment, two first conductive layers 105a, 105b wrap surfaces of the electronic components 101, 103, 104 to provide an electrical connection between the DC to DC converter 100 and a first carrier (which is a circuit board herein and not shown). The inductive component 106, the first electronic component 101, the second electronic components 107 and the third electronic components 103, 104 are an inductor, a control chip, capacitors and FETs respectively.

The DC to DC converters described above all comprises a number of separate electronic components. However, development of package technologies allows more and more electronic components to be packaged into an IC, which further shrinks volume of the electronic components. Therefore, the electronic component wrapped with a connecting conductor may also be an IC. Furthermore, it should be noted that, although the previous embodiments all relate to application of an assembled circuits in a DC to DC converter, the assembled circuit of this invention may also be applied in other kinds of converters to provide connections between the converter and a circuit board.

This invention adopts a large-area conductive layer as a pin structure. This may not only help to enhance the thermal dissipation performance of the individual electronic components, but also facilitate the improvement of the thermal dissipation performance of the DC to DC converter as a whole. Hence, the connecting structure of this invention may shrink the overall size and improve the power density of the converter.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A package structure, comprising:
    a substrate, comprising a top surface, a bottom surface and a lateral surface;
    a coil disposed in the substrate, wherein the coil comprises:
        a first plurality of through holes disposed in the substrate in a first sequence; and
        a second plurality of through holes disposed in the substrate in a second sequence, wherein each of the first plurality of through holes has a corresponding through hole of the second plurality of through holes, wherein each of the first plurality of through holes is electrically connected to the corresponding through hole of the second plurality of through holes via the bottom surface; and each of the first plurality of through holes is electrically connected to an adjacent through hole of the corresponding through hole in the second sequence via the top surface so as to form the coil;
    a conductive pattern wrapping a first surface of the substrate, wherein the first surface comprises a portion of the top surface, a portion of the bottom surface and a portion of the lateral surface, wherein the coil is electrically connected to the conductive pattern; and
    a first conductive element disposed over the lateral surface of the substrate, wherein the first conductive element is electrically connected to the conductive pattern.

2. The package structure according to claim 1, wherein the substrate is made of a co-fired magnetic material.

3. The package structure according to claim 2, wherein the co-fired magnetic material is a multi-layer magnetic material.

4. The package structure according to claim 1, wherein the conductive pattern is made of a patterned conductive layer or a lead frame.

5. The package structure according to claim 1, further comprising a first carrier on the bottom surface of the substrate, wherein the coil is electrically connected to the first carrier via the conductive pattern.

6. The package structure according to claim 5, wherein the first carrier is a circuit board.

7. The package structure according to claim 5, further comprising a second carrier on the top surface of the substrate, wherein the coil is electrically connected to the second carrier via the conductive pattern.

8. The package structure according to claim 1, further comprising a second conductive element disposed on a portion of the conductive pattern on the top surface of the substrate, wherein the second conductive element is electrically connected to the conductive pattern.

9. The package structure according to claim 8, wherein the second conductive element is one of an inductor, a resistor, a capacitor, a FET, a control chip and an integrated circuit.

10. The package structure according to claim 1, wherein the first conductive element is one of an inductor, a resistor, a capacitor, a FET, a control chip and an integrated circuit.

11. The package structure according to claim 1, wherein the package structure is adapted for a DC to DC converter.

12. The package structure according to claim 1, wherein the conductive pattern comprises a pin conductor having a first pin and a second pin, wherein the first pin is electrically connected to a first terminal of the coil and the second pin is electrically connected to a second terminal of the coil.

13. The package structure according to claim 1, wherein the conductive pattern comprises a connecting conductor and a pin conductor, wherein at least one portion of the connecting conductor is electrically isolated from the pin conductor.

14. The package structure according to claim 1, wherein the conductive pattern comprises a connecting conductor and a pin conductor, wherein the connecting conductor is electrically isolated from the pin conductor.

15. The package structure according to claim 14, further comprising a second conductive element disposed on a portion of the conductive pattern on the top surface of the substrate, wherein the second conductive element is electrically connected to the connecting conductor, and the coil is electrically connected to the pin conductor.

16. The package structure according to claim 15, further comprising a first carrier on the bottom surface of the substrate, wherein the connecting conductor is electrically connected to the pin conductor via the first carrier.

17. The package structure according to claim 15, further comprising a third conductive element, wherein the connecting conductor is electrically connected to the pin conductor via the third conductive element.

18. The package structure according to claim 1, wherein the conductive pattern comprises at least one of silver (Ag), palladium (Pd), gold (Au) and copper (Cu).

19. A package structure, comprising:
a substrate, comprising a top surface and a bottom surface;
a coil disposed in the substrate, wherein the coil comprises:
    a first plurality of through holes disposed in the substrate in a first sequence; and
    a second plurality of through holes disposed in the substrate in a second sequence, wherein each of the first plurality of through holes has a corresponding through hole of the second plurality of through holes, wherein each of the first plurality of through holes is electrically connected to the corresponding through hole of the second plurality of through holes via the bottom surface; and each of the first plurality of through holes is electrically connected to an adjacent through hole of the corresponding through hole in the second sequence via the top surface so as to form the coil; and
a lead frame wrapping a first surface of the substrate, wherein the first surface comprises a portion of the top surface, a portion of the bottom surface and a portion of the lateral surface, wherein the coil is electrically connected to the lead frame.

\* \* \* \* \*